United States Patent [19]
Seyferth et al.

[11] Patent Number: 4,719,273
[45] Date of Patent: * Jan. 12, 1988

[54] METHOD FOR FORMING NEW PRECERAMIC POLYMERS CONTAINING SILICON

[75] Inventors: Dietmar Seyferth, Lexington, Mass.; Yuan-Fu Yu, Dayton, Ohio; Gudrun E. Koppetsch, Arlington, Mass.

[73] Assignee: Massachusetts Institute of Technology, Cambridge, Mass.

[*] Notice: The portion of the term of this patent subsequent to Jan. 27, 2004 has been disclaimed.

[21] Appl. No.: 843,139

[22] Filed: Mar. 24, 1986

Related U.S. Application Data

[63] Continuation-in-part of Ser. No. 772,375, Sep. 4, 1985, Pat. No. 4,639,501.

[51] Int. Cl.$^4$ ............................................. C08G 77/06
[52] U.S. Cl. ........................... 528/15; 522/99; 522/172; 522/135; 522/148; 522/60; 522/62; 522/66; 556/430; 556/479; 528/21; 528/24; 528/31
[58] Field of Search ................ 556/430, 479; 522/99, 522/172, 135, 148, 60, 62, 66; 528/31, 15, 24, 21

[56] References Cited

U.S. PATENT DOCUMENTS

| | | |
|---|---|---|
| 3,108,985 | 10/1963 | Wexer . |
| 3,853,567 | 12/1974 | Verbeek . |
| 3,892,583 | 7/1975 | Winter et al. . |
| 4,310,651 | 1/1982 | Baney et al. . |
| 4,312,970 | 1/1982 | Gaul, Jr. . |
| 4,537,942 | 8/1985 | Brown-Wensley et al. . |
| 4,546,163 | 10/1985 | Haluska . |
| 4,602,050 | 7/1986 | West et al. ...................... 522/135 |
| 4,611,035 | 9/1986 | Brown-Wensley et al. ......... 556/430 |

OTHER PUBLICATIONS

R. W. Rice, Amer. Ceram. Soc. Bull., 62:889-892 (1983).
Penn et al., J. Appl. Polymer Sci., 27:3751-3761 (1982).
S. Yajima, Amer. Ceram. Soc. Bull., 62:893-898;903 (1983).
C. L. Shilling, Jr. & T. C. Williams, Technical Report, ONR Contract N00014-81-C-0682 (1983, Gov. Rep. Announce Index U.S. 84 (18): 1984).
Aitken, C. et al., J. Organomet. Chem., 279: C11-C13 (1985).
Andrianov, K. A. et al., Izv. Akad. Nauk SSSR, Otd. Khim. Nauk 948 (1963) and 860 (Eng. Trans.).
Zhinkin, D. Y. et al., Zh. Obshch Khim., 33:1293 (1963) and 1263 (Eng. Trans.).
Kantor, S. W. et al., J. Am. Chem. Soc., 77: 1685 (1955).
Hurd, D. T., J. Amer. Chem. Soc., 67:1812 (1945).
Millard, M. M. et al., J. Organomet. Chem., 52:283 (1973).

*Primary Examiner*—Melvyn I. Marquis
*Attorney, Agent, or Firm*—George W. Neuner; Ronald I. Eisenstein

[57] ABSTRACT

A method of forming preceramic polymers by mixing (A) an organic polysilane, preferably either a methylpolysilane of the formula $[(RSiH)_x(RSi)_y]_n$, (where R is a lower alkyl group having from 1 to about 6 carbon atoms, a cycloalkyl group having from 3 to about 6 carbon atoms, a substituted or unsubstituted lower aryl group having from 6 to about 10 carbon atoms, a tri(-lower)alkyl- or di(lower)alkylsilyl group $x+y=1$, (x and y are each $>0$ and also $x=1$, $y=0$), and n is an integer greater than 1) or a polycarbosilane having repeat units of the formula $[R^aSi(H)-(CH_2)_q]$, $[R^aSi(H)-CH=CH]$, and $[R^aSi(H)-C\equiv C]$ (where $R^a$ is H, a lower alkyl group having from 1 to about 6 carbon atoms, a cycloalkyl group having from 3 to about 6 carbon atoms, a substituted or unsubstituted lower aryl group having from 6 to about 10 carbon atoms, q is an integer 1 or greater), with (B) an organic or organisilicon compound having at least two alkenyl groups and allowing the mixture to react is disclosed. Preferably, the alkenyl group is a vinyl group. The reaction is preferably initiated by the generation of reactive free radicals. Novel preceramic polymers formed by this method are also disclosed.

70 Claims, 3 Drawing Figures

METHOD FOR FORMING NEW PRECERAMIC POLYMERS CONTAINING SILICON

The Government has rights in this invention pursuant to Contract Numbers AFOSR-83-0003B and AFOSR-85-0265 awarded by the Department of the Air Force.

This is a continuation-in-part of U.S. patent application Ser. No. 772,375 filed Sept. 4, 1985, now U.S. Pat. No. 4,639,501.

The present invention relates to a process for preparing preceramic polymers containing silicon, carbon and other elements, and for their pyrolysis to ceramic materials.

There is a great deal of interest in preceramic polymer material which can be pyrolyzed to yield SiC, $Si_3N_4$ and other silicon-based ceramic materials. R. W. Rice, *Amer. Ceram. Soc. Bull.*, 62: 889–892 (1983). Applications for such polymers include, among others:

1. formation into complex shapes and subsequent pyrolysis to give a ceramic material of the same shape;
2. spinning into continuous fibers whose subsequent pyrolysis yields ceramic fibers;
3. as a matrix material for carbon or ceramic fibers, or as a binder for ceramic powders (with subsequent pyrolysis to form a ceramic body);
4. oxidation-resistant coatings on otherwise oxidizable materials (such as carbon/carbon composites)-after the polymer coating is made, it can be pyrolyzed to give the resistant ceramic coating;
5. infiltration of porous ceramic bodies such as ones obtained from reaction-sintered silicon nitride by the polymer itself (if liquid) or by a solution of the polymer, with subsequent pyrolysis to form a ceramic, resulting in better strength, oxidation resistance, etc., of the body; and
6. formation of thin films of the ceramic material for electronics applications.

For instance, Penn et al., *J. Appl. Polymer Sci.*, 27: 3751–61 (1982) describe the preparation of silicon carbide-silicon nitride fibers from a polycarbosilazane precursor. Tris(N-mehtylamino)methylsilane monomer was formed by reaction of monomethylamine and methyltrichlorosilane in dry petroleum ether and a polycarbosilazane resin was formed by passing the monomer over glass Raschig rings at 520° C. The brittle polymer was soluble in methylene chloride and chloroform, etc. This product was spun into fibers, crosslinked in air and then pyrolyzed to give ceramic fibers.

Other polymer precursors for forming silicon carbide and silicon nitride creamics have been described in U.S. Pat. Nos. 3,108,985; 3,853,567; 3,892,583; 4,310,651 and 4,312,970. These linear or crosslinked polymers and processes for producing ceramic materials have generally been found to be deficient in one or more ways.

S. Yajima, *Amer. Ceram. Soc. Bull.*, 62: 893–898; 903 (1983) discloses using $(CH_3)_2SiCl_2$ as a starting material for a preceramic polymer for the preparation of SiC-containing ceramics. The polymer of Yajima is prepared by sodium metal condensation of $(CH_3)_2SiCl_2$ to result in a polysilane, $—[(CH_3)_2Si]_n—$ (n is approximately 30). This polysilane can then form either a "Mark I" polymer or a "Mark III" polymer depending upon the treatment used. Heating in an autoclave under argon at 100 kPa at 450°–470° C. for 14 hours results in a Mark I polymer while adding a few percent of a polyborodiphenylsiloxane and heating under nitrogen at ambient pressure at 350° C. for 10 hours results in the Mark III polymer. In either case, the poly-silicon backbone is converted to a polymeric chain in which the main repeat unit is:

(I)

The Mark I polymer also contains some $—[(CH_3)_2SiCH_2]—$ units. The Mark III polymer contains some Si—Si bonds in the for of $—[(CH_3)_2Si—Si(CH_3)_2]_n(($n$=2$–$8)$ units and a low percentage of $[(C_6H_5)_2SiO]$ units. These preceramic polymers can be processed to give ceramic fibers containing SiC, some free carbon and some $SiO_2$. However, there are problems associated with these polycarbosilane-derived ceramics. They have a tendency to crystallize below 1200° C.; they have a $SiO_2$ content as a result of an oxidative cure step and free carbon, and a relatively low ceramic yield is obtained upon their pyrolysis for a commercial product. While the ceramic yield for the Mark III polymer is 68%, the yield for the Mark K polymer is only 54%.

Methylsilicon compounds with a 1C:1Si stoichiometry are known. These include $CH_3SiCl_3$ and $CH_3SiHCl_2$. The former, however, yields mostly crosslinked, insoluble products on treatment with an alkali metal in a compatible diluent making its use unsuitable. $CH_3SiHCl_2$, in theory, should give $[CH_3SiH]_n$ cyclic oligomers and linear polymers on reaction with an alkali metal. A process has been discussed where $CH_3SiHCl_2$ comprises about 30% of a mixed organochlorosilane reaction mixture which is thereafter treated with metallic potassium. See C. L. Schilling, Jr. and T. C. Williams, *Technical Report*, ONR Contract N00014-81-C-0682 (1983); *Gov. Rep. Announce. Index* (U.S.), 84 (18): 48 (1984). The 30% $CH_3SiHCl_2$ contribution yielded a final product, $[(CH_3SiH)_{0.2}(CH_3Si)_{0.8}]$.

It would be useful to have a polymer precursor that is formed from readily available and relatively cheap starting materials, that is stable at room temperature, is soluble in organic solvents and whose pyrolysis can provide a high yield of ceramics upon pyrolysis.

SUMMARY OF THE INVENTION

It has now been found that the hydrosilylation reaction of (A) organic polysilanes having a Si—H functional group, preferably either organopolysilanes of the formula $[(RSiH)_x(RSi)_y]_n$ (where R is a lower alkyl group having from 1 to about 6 carbon atoms, a cycloalkyl group having from 3 to about 6 carbon atoms, a substituted or unsubstituted lower aryl group having from 6 to about 10 carbon atoms, $x+y=1$ (x and y are each $>0$ and also the case where $x=1$ and $y=0$) and n is an integer greater than 1) or polycarbosilane polymers containing Si and C atoms in the polymeric backbone such as, for example, polymers having repeat units of the formula $[R^aSi(H)—(ORG)_q]$, i.e.,

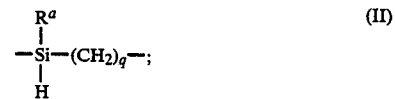
(II)

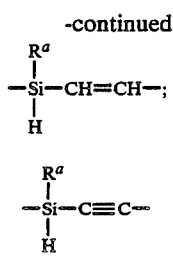

(where q=integers 1 or greater; $R^a$ is H, a lower alkyl group having from 1 to about 6 carbon atoms, a cycloalkyl group having from 3 to about 6 carbon atoms, or a substituted or unsubstituted lower aryl group having form 6 to about 10 carbon atoms, and (ORG) is a difunctional alkylene, alkenylene or alkynylene group) with (B) an organic or organosilicon, compound having at least two alkenyl groups converts these reactants into preceramic materials whose pyrolysis provides a ceramic in high yield. The above reactants (A) and (B) are mixed in an organic solvent. Thereafter, energy may be added to increase the rate of reaction. The reaction is preferably carried out in the presence of a suitable catalyst. Preferably, a free radical or transition metal catalyst is used. More preferably, one uses a free radical catalyst. The free radical catalyst cana be a peroxide or an azo compound. More preferably, the free radical catalyst is an azo compound.

The preceramic polymers of the present invention are formed by the above described hydrosilylation reaction of (A) and (B). These polymers are then pyrolyzed to yield ceramic materials.

DETAILED DESCRIPTION OF THE INVENTION

Figure 1:
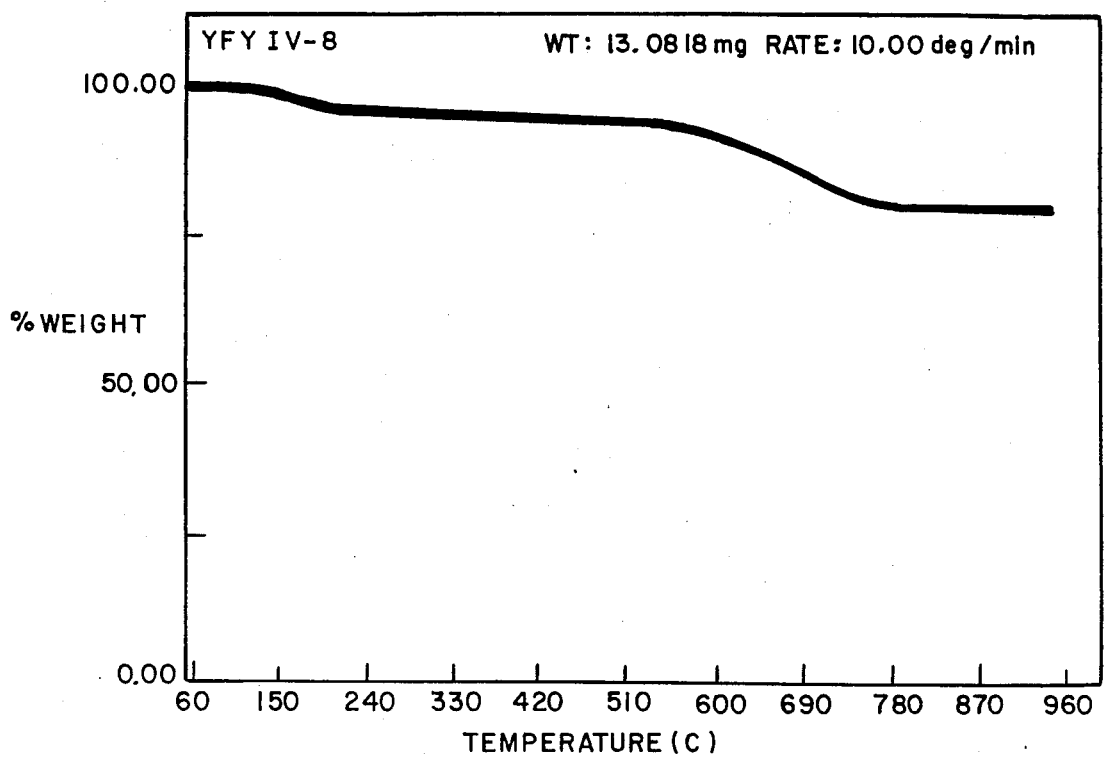
FIG. 1 is a TGA curve of a polymer (YFY IV-8) formed by the hydrosilylation reaction of a polycarbosilane with [(CH$_3$)(CH$_2$=CH)SiNH]$_3$.

We have now discovered that the hydrosilylation reaction of an organic or organosilicon compound containing at least two alkenyl groups with an organic polysilane have Si—H functional groups results in novel preceramic polymers that have many applications. These preceramic polymers typically will provide higher ceramic yields upon pyrolysis than the "parent" precursor compounds. Further, by appropriate selection of reactants as disclosed herein this process will surprisingly enable one to obtain a preceramic polymeric precursor whose pyrolysis gives only SiC.

The organic polysilanes should contain a plurality of Si—H functional groups to most effectively undergo the hydrosilylation reaction in accord with this invention and result in a network polymer. Preferably, at least about 30% of the silicon atoms in the chain should be Si—H functional groups, more preferably at least about 50% of the silicon atoms in the chain should be Si—H functional groups.

Preferably, the organic polysilanes are either organopolysilanes of the formula [(RSiH)$_x$(RSi)$_y$]$_n$ (where R is a lower alkyl group having from 1 to about 6 carbon atoms, a cycloalkyl group having from 3 to about 6 carbon atoms, or a substituted or unsubstituted lower aryl group having from 6 to about 10 carbon atoms; n is an integer greater than 1 and x+y=1 (x and y are each >0, and also x=1, y=0)) or polycarbosilane polymers containing a multiplicity of repeat units of the formula [R$^a$Si(H)—(CH$_2$)$_q$] where q is an integer equal to 1 or greater, and R$^a$ is H, a lower alkyl group having from 1 to about 6 carbon atoms, a cycloalkyl group having 3 to about 6 carbon atoms and a substituted or unsubstituted lower aryl group having 6 to about 10 carbon atoms). The hydrosilylation reaction results in a product which gives a higher ceramic yield on pyrolysis than obtained with either the organopolysilane obtained from alkali metal condensation of CH$_3$SiHCl$_2$ alone or the unmodified polycarbosilane alone.

The reaction of CH$_3$SiHCl$_2$ with an alkali metal produces methylsilicon compounds of the formula [(CH$_3$SiH)$_x$(CH$_3$Si)$_y$]$_n$ where x+y=1 and n is an integer greater than 1 (hereinafter these compounds will be referred to as "methylpolysilanes"). However, this product itself is not very useful as a preceramic polymer. Those methylpolysilanes which upon pyrolysis gave a ceramic yield greater than 50% have a limited solubility in organic solvents. Such methylpolysilanes are difficult to process. The methylpolysilanes which were more soluble in organic solvents because their crosslinking was not as excessive, in contrast, usually provide an unacceptably low ceramic yield on pyrolysis, e.g., 12-27% in various runs. The methylpolysilanes of the above formula further typically give ceramic products on pyrolysis which contain an excess of free silicon rather than the desired one silicon to one carbon composition. Consequently, alkali metal condensation of CH$_3$SiHCl$_2$ does not result in an ideal preceramic polymer for the generation of SiC.

We have found that the hydrosilylation reaction between (A) organopolysilanes of the formula [(RSiH)$_x$(RSi)$_y$]$_n$ and (B) an organic or organosilicon compound containing at least two alkenyl group results in extremely useful preceramic polymers as described in our copending patent application U.S. Ser. No. 772,375 filed Sept. 4, 1985. The preceramic compound obtained after reacting the above described organopolysilanes with the alkenyl-containing organic or organosilicon compounds in an organic solvent on pyrolysis generally gives ceramic yields greater than 50%. This resulting preceramic polymer generally is soluble in organic solvents and gives higher ceramic yields on pyrolysis than the organopolysilane resulting from alkali metal condensation of CH$_3$SiHCl$_2$.

One can use any organopolysilane of the formula [(RSiH)$_x$(RSi)$_y$]$_n$ which is soluble in the organic solvent being used. While the organopolysilane is generally cross-linked, i.e., y>O, one can use linear polymers having repeat units of the above formula and where x=1, y=0. A polymer where x=1 and y=0 which we have converted to a preceramic polymer by hydrosilylation as described herein is [C$_6$H$_5$SiH]$_n$, poly(phenylsilylene). This polymer has been described by Aitken, C. et al, J. Organomet. Chem., 279: C11-C13 (1985). With any of the organopolysilanes discussed herein, R is preferably a lower alkyl, more preferably, R is CH$_3$. However, mixtures of compounds containing different R groups can be used. Additionally, mixtures of compounds of the aforesaid general formula, i.e., [(RSiH)$_x$(RSi)$_y$]$_n$ and [(R'SiH)$_{x'}$(R'Si)$_{y'}$]$_{n'}$, can be used to obtain further flexibility in tailoring the properties of the product, R', x', y' and n' have the same meaning as R, x, y and n above. These mixtures are particularly useful to obtain a ceramic product that has no excess free silicon or excess free carbon.

Another preferred group of organic polysilanes that can be used in the hydrosilyation reaction described herein to result in novel preceramic polymers are polycarbosilanes containing a multiplicity of repeat units of the above formula II, i.e. to result in novel preceramic polymers. Typically, the pyrolysis of this new polymer in accord with this invention gives a black ceramic solid in a yield that is about 10% to 60% greater than the yield from the parent polycarbosilane.

In addition to polymers containing the formula II repeat units, wherein the polymer contains single bonded carbons, polymers containing carbon-carbon multiple bonds in the chain, e.g., —[R$^a$Si(H)—CH=CH]—, (formula III) and —R$^a$Si(H)—C≡C]—, formula IV may be used. The latter are prepared by the reaction of the appropriate dichlorosilane, R$^a$SiHCl$_2$, with reagents such as XMgC≡CMgX, (x is a halogen, preferably Cl, Br or I). LiC≡CLi, (MgC≡C)$_n$, and the like. Hydrogenation of the —[R$^a$Si(H)—C≡C]— units in the polymer gives the —[R$^a$Si(H)—CH=CH]— units (catalytic hydrogenation, e.g., with a Lindlar catalyst, or the hydroboration/protodehydroboronation sequence). For instance, a 1:1 molar reaction of LiC≡CLi with CH$_3$SiHCl$_2$ followed by addition of some (CH$_3$)$_2$SiHCl to react with remaining C—Li termini gave a brown, viscous liquid whose analysis and spectroscopic properties were in agreement with the —[(CH$_3$)Si(H)—C≡C]—$_n$ formulation. This material reacted with [(CH$_3$)(CH$_2$=CH)SiNH]$_3$ in the presence of AIBN catalyst in refluxing benzene to give a white solid product whose pyrolysis (to 1000° C.) gave ceramic yields in excess of 77%.

The polycarbosilane polymer must contain sufficient repeat units of the formula II, III or IV, e.g. [R$^a$Si(H)—(CH$_2$)$_q$], to undergo the hydrosilylation reaction in accord with this invention, in addition to other repeat units, such as [R$^a{}_2$Si(CH$_2$)$_q$] (e.g. the Yajima polymers) and preferably contains at least about 25 mole % of such repeat units of formulae II, III or IV. More preferably the polycarbosilane polymer contains at least about 35 mole % of repeat units of formulae II, III or IV. Most preferably, the polymer contains at least about 50 mole % repeat units of formulae II, III or IV.

The polymer may also contain a mixture of repeat units of the above described formulae II, III or IV, e.g., both [R$^a$Si(H)—(CH$_2$)$_q$] and [R$^{a'}$Si(H)—(CH$_2$)$_{q'}$] (R$^{a'}$ and q' are defined the same as R$^a$ and q, respectively, but R$^{a'}$ may be different than R$^a$ and q' may be different than q) or [R$^a$Si(H)—(CH$_2$)$_q$] and [R$^a$Si(H)—CH=CH]. R$^a$ is preferably a lower alkyl group, more preferably R$^a$ is CH$_3$. Preferably q is from 1 to 3; more preferably q is equal to one.

The polycarbosilane and the alkenyl-containing organic or organosilicon compound are typically added in a wide range of weight ratios or polycarbosilane to alkenyl-containing compound. Ratios ranging from 14:1 to 1:1 are typically used, but other weight ratios can be used depending on the particular starting materials and their pyrolysis characteristics.

Organic or organosilicon compounds containing at least two alkenyl groups are preferably used in the present invention. More preferably, one uses cyclic organic or organosilicon compounds containing at least three alkenyl substituents. The molar ratio of SiH groups in the polysilane to alkenyl groups in the organic or organosilicon compound is preferably greater than 3, more preferably it is 6 or more.

The types of alkenyl-containing organic or organosilicon compounds that can be used are readily determined by a person of ordinary skill in the art. The alkenyl group itself is preferably a lower alkenyl having 2 to 6 carbon atoms such as vinyl, allyl, 3-butenyl, α-propenyl, α-styryl, etc. More preferably, the alkenyl group used is vinyl, CH$_2$=CH. Also, the compounds can be wholly organic polyvinyl compounds such as divinylbenzene or a polybutadiene with a high C$_{1,2}$ double bond content. Also, they may be polyalkenyl compounds, e.g., β-trivinyl-N-triphenylborazine, triallylcyanurate, etc. More preferably, polyvinyl silicon compounds are used. Polyvinyl silicon compounds useful for the practice of this invention include those of the formula [R$^1{}_2$(CH$_2$=CH)Si]$_2$Y, [R$^1$(CH$_2$=CH)]$_2$Y [(CH$_2$=CH)$_3$Si]$_2$Y, [R$^1$(CH$_2$=CH)Y]$_n$ where Y=O, S, NH, NR$^2$, CH$_2$, CH$_2$CH$_2$,

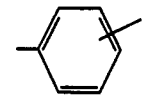

(o, m, or p) and other organic bridges; additionally Y may be absent, i.e., as in R$^1{}_n$(CH$_2$=CH)$_{3-n}$Si—Si(CH=CH$_2$)$_{3-q}$R$^1{}_q$(n, q=0,1,2; n may equal q or be different); (CH$_2$=CH)$_4$Si; cyclo[R$^1$(CH$_2$=CH)SiY$^1$]$_m$ or [(CH$_2$=CH)$_2$SiY$^1$]$_m$, Y$^1$ is O, S, NH, NR$^2$, CH$_2$, CH=CH, C≡C; m is 2 or greater, where Y$^1$ is NH, NR$^2$, NR$^2$, S, or CH$_2$, CH=CH, C≡C; m is 3 or greater where Y' is O; R$^1$ is substituted or unsubstituted lower alkyl having 1-6 carbon atoms or a substituted or unsubstituted lower aryl group having 6-10 carbon atoms, R$^2$ is defined as is R$^1$ and can be the same or different. These examples are illustrative and not meant to be restrictive. For instance, these compounds can have a substituted vinyl group, an allyl group, or a substituted allyl group in place of the vinyl group.

A particularly useful type of silicon-containing polyvinyl compound is the class of polymers of type [—R$^1$-(Un)SiC≡C—]$_n$ (R$^1$ as defined above, and Un is an unsaturated moiety as described above such as a substituted or unsubstituted vinyl group, a substituted or unsubstituted allyl group, etc., the example where, R$^1$=CH$_3$, and Un=vinyl are preferred), which are prepared by reaction of the respective R(Un)SiCl$_2$ with XMgC≡CMgX, LiC≡CLi, (MgC≡C)$_n$ and the like. (X is a halogen, preferably Cl, Br or I). Use of this type of polyvinyl compound has special advantages: (1) no other elements (e.g., O, N, S) are introduced; (2) since the pyrolysis of these polymers gives SiC plus an excess of free carbon, while the pyrolysis of the polysilane [CH$_3$SiH)$_x$(CH$_3$Si)$_y$]$_n$ gives SiC plus an excess of free silicon, the pyrolysis (at sufficiently high temperatures) of the reaction product of the two different polymers (using appropriate stoichiometry) will give a ceramic product which is essentially only SiC, with very little of either free carbon or silicon. This is very important and therein lies the novelty and uniqueness of this approach. An excess of either free carbon or free silicon will usually be detrimental to the properties of the ceramic material, but by use of this process such free carbon or free silicon can be avoided.

Polyvinyl silicon compounds useful in the present invention can readily be prepared by well known synthesis techniques. For example, using commercially available methylvinyldichlorosilane one can readily obtain cyclo—$[(CH_3)(CH_2=CH)SiO]_m$, m equals 4, 5 or 6; cyclo—$[(CH_3)(CH_2=CH)SiNH]_m$, m equals 3 and 4; and cyclo—$[(CH_3)(CH_2=CH)SiS]_m$, m equals 3, when the methylvinyldichlorosilane is reacted with $H_2O$, $NH_3$ or $Li_2S$, respectively. These poly(vinyl) compounds react readily with organic polysilanes having a Si—H functional group, preferably either the organopolysilane or the polycarbosilane, in an organic solvent in the presence of a catalyst.

The hydrosilylation reaction can be initiated by means well known to those of ordinary skill in the art. Such initiation means include ultraviolet irradiation or more preferably catalytic initiation. A catalyst may be added which on appropriate input of energy provides reactive free radicals. Catalysts that can be used in the practice of this invention include transition metal catalysts or free radical catalysts.

The various catalysts that can be used are well known in the art. Transition metal hydrosilylation catalysts include but are not limited to complexes of platinum (including $H_2PtCl_6.6H_2O$), rhodium, ruthenium iridium, palladium, nickel, cobalt, iron, manganese and other metals, as summarized in Lukevics, E. et al, *J. of Organomet. Chem. Library*, 5:1–180 (1977).

When transition metal catalysts are used, the prepolymer product should preferably be treated to remove the metal species before forming the ceramic product. The free radical catalysts include peroxide and azo compounds. These compounds are well known to those of ordinary skill in the art. For example, the peroxide can be an organic peroxide such as benzoyl peroxide. Most preferably, one utilizes azo compounds. Such azo catalysts are well known to those skilled in the art and are readily available, typical examples include azobisisobutyronitrile (AIBN), other $R^3(CH_3)(CN)CN=NC(CN)(CH_3)R^3$ compounds ($R^3 = C_2H_5$, iso-$C_4H_9$), and the like.

To prepare the preceramic polymers of this invention, the organic polysilane, preferably either the organopolysilane or the polycarbosilane, is dissolved in an organic solvent, for example, xylenes, hexane, benzene, or tetrahydrofuran (THF). Most typically, a catalyst is then added to the solvent, and the resulting mixture is stirred at room temperatures until the catalyst dissolves. At this point the alkenyl containing organic or organosilicon compound is added to the mixture and sufficient energy is provided to cause the initiation of the hydrosilylation reaction. For example, the energy may be added by heating the reaction to 70°–90° C. for a sufficient time for the constituents to react. However, care must be taken to avoid excessively long heating times or an insoluble polymer may result. The resulting reaction mixture is cooled to room temperature and the preceramic polymer is removed from solution. This can be done by isolation techniques well known in the art. Typically, distillation methods are used, preferably trap-to-trap distillation, to remove volatile materials.

When ultraviolet irradiation is used, the reactants are combined in the organic solvent and then exposed to ultraviolet irradiation to initiate the reaction. Ultraviolet irradiation can also be used as the energy source along with a catalyst which is decomposed to radicals by such radiation.

The methods described herein generally result in the formation of preceramic polymers in nearly quantitative yield. Pyrolysis of the resulting preceramic polymers provides ceramic yields that for the organopolysilane containing polymer are generally 50% or more, for the polycarbosilane containing polymers are generally 60% or more and, in some cases, as high as 82%. The polymer is pyrolyzed in a nitrogen or inert gas atmosphere for a sufficient time and at a sufficient temperature to form a ceramic product.

The use of the alkenyl-containing organic or organosilicon compound simplifies the process and/or improves the ceramic yield, but, more significantly, when the appropriate alkenyl-containing compound is reacted with an organopolysilane in the correct stoichiometry, the reaction product incorporates both starting materials. When this reaction product is pyrolyzed, the excess silicon normally obtained in the pyrolysis of the organopolysilane alone and the excess carbon introduced via the alkenyl-containing compound can combine so that there is no substantial excess of either element in the ceramic product. Consequently, one can obtain a ceramic product with less than about 0.5% of free silicon or less than about 0.5% of free carbon, i.e., a ceramic polymer containing virtually no free carbon or no free silicon. The exact combination of the two compounds necessary to result in the desired stoichiometry can be calculated by a person of ordinary skill in the art based on the results of the analyses of the ceramic products obtained from the pyrolysis of polymers of several different polysilane/alkenyl compound compositions, i.e., an empirical approach.

The hydrosilylation reactions involving the polycarbosilane and the alkenyl containing organic or organosilicon will give a new polymer whose pyrolysis will give ceramic materials which contain an excess of free carbon, because both the polycarbosilane and the alkenyl containing organic or organosilicon component introduced will provide an excess of carbon upon pyrolysis. However, the excess carbon can be reduced by using a binary Si—H polymer system in the hydrosilylation procedure, i.e., the polycarbosilane and a polysilane whose pyrolysis gives a ceramic product which contains an excess of silicon. Preferably one would use the organopolysilanes described herein, as the polysilane. Thus, a ternary system, i.e., a hydrosilylation reaction involving an organopolysilane along with the polycarbosilane and the alkenyl-containing compound in appropriate amounts will result in a compound with no substantial excess of either element in the ceramic product. More preferably, in the organopolysilane used R is a lower alkyl group, most preferably R is $CH_3$. Using a proper mixture of the polycarbosilane, the organopolysilane and the alkenyl-compound which can be calculated from the results of the analyses of the pyrolysis product of each hydrosilylation system alone, i.e., polycarbosilane and alkenyl-containing compound and organopolysilane and alkenyl-containing compound, respectively, one can obtain on pyrolysis a ceramic product in which the excess of either free carbon or free silicon is minimal.

The invention will be further illustrated by the examples that follow:

A. GENERAL

All glassware was flame-dried under vacuum or under a stream of nitrogen prior to use. Tetrahydrofuran (THF) and benzene were distilled from sodium and benzophenone ketyl. Hexanes were distilled from LiAlH$_4$. Solvents were deoxygenated by bubbling nitrogen or argon gas through them prior to use. Methyldichlorosilane (CH$_3$SiHCl$_2$) and (CH$_3$)(CH$_2$=CH)SiCl$_2$ were purchased and were distilled from magnesium before use. Reagent grade sodium shot was further purified by creating a dispersion in refluxing xylene and allowing this to cool, with stirring. This served to remove most of the oxide coating.

$^1$H NMR spectra were recorded on a JEOL-FX-90Q Spectrometer operating at 90 MHz. Photolysis was performed in a Rayonet Photoreactor equipped with sixteen 360 nm medium pressure mercury lamps.

Thermal analyses were performed by using either a DuPont 950 TGA connected to a DuPont thermal analysis system or a Perkin-Elmer TGS-2 Thermogravimetric Analyzer interfaced with a System 7/4 Thermal Analysis Controller. Samples were heated, under nitrogen, from 25°–1000° C. at a rate of 10° C./min. Large scale pyrolyses were carried out in fused silica boats using a Lindberg 59344 tube furnace (25°–1000° C., 10° C./min.) under a nitrogen atmosphere. Scanning electron micrographs were obtained using an AMR instrument, operating at 20 KV. X-ray powder diffraction pattern was obtained using a Phillips X-ray diffractometer with a CuK α radiation source and a Ni filter (λ=1.5418A).

B. PREPARATION OF [(CH$_3$SiH)$_x$(CH$_3$Si)$_y$]$_n$ OIL POLYMER IN HEXANE/THF MIXED SOLVENT

In a dry box, a 1 liter three-necked, round-bottomed flask equipped with a stir-bar, a dropping funnel and a reflux condenser was charged with 75.0 g (3.26 mol) of sodium metal. The flask was attached to a Schlenk manifold, evacuated and flushed with nitrogen. THF (70 ml) and hexane (420 ml) were added and the dropping funnel was charged with 150 ml (1.44 mol) of methyldichlorosilane. Methyldichlorosilane was added slowly into the flask over a 3 hour period. The reaction solution turned purple and by the end of the addition was at gentle reflux. The reaction mixture was stirred at room temperature for 2 hours and then heated at reflux for 16 hours. After it had been cooled to room temperature, the reaction mixture (except for the large NaCl crystals) was transferred via a cannula into a heavy-walled glass bottle. The mixture was centrifuged and the clear, colorless supernatant layer transferred by cannula into a 1 liter round-bottomed flask equipped with a stir-bar. Hexane (200 ml) and THF (20 ml) were added to the remaining solids, the mixture was centrifuged again, and the separated liquid combined with the first separated supernatant layer. Solvent was removed by trap-to-trap distillation until the volume of the residue was about 100 ml, and the remaining liquid was transferred by cannula into a weighed 250 ml round-bottomed flask. Remaining solvent was removed by trap-to-trap distillation at approximately 0.05 mm Hg at room temperature to give 51.2 g (81%, 1.16 mol) of a cloudy white oil.

$^1$H NMR (90 MHz, C$_6$D$_6$): δ0.37 (broad, SiCH$_3$, 3.74H), 3.92 (broad, SiH, 1 H).

NMR integration of the product gave a constitution of [(CH$_3$SiH)$_{0.8}$(CH$_3$Si)$_{0.2}$]$_n$.

IR (thin film, cm$^{-1}$): 2967(s), 2900(s), 2800(w), 2099(vs), 1410(s), 1385(w), 1249(s), 1055(br), 933(s), 865(vs), 770(vs), 685(br), 650(sh), 585(w).

Molecular weight (cryoscopic in benzene): 600 g/mol.

Anal. (material from another similar preparation). Calcd. for CSiH$_{3.76}$: C, 27.39; H, 8.55; Si, 64.05. Found: C, 27.49; H, 8.98; Si, 61.58%.

TGA (25°–1000° C., 10° C./min): 20% yield of a gray-black ceramic solid. Pyrolysis of a sample from another preparation in a tube furnace gave a gray-black ceramic solid in 36% yield (by weight). Anal. of Ceramic. Found: C, 22.93; Si, 75.99%.

The liquid obtained by this procedure is very air-sensitive, particularly when its effective surface area is high, as when in contact with a fritted funnel or a paper or cloth towel (in which cases spontaneous inflammation may occur).

Other, similar reactions have given 62–75% yields of [(CH$_3$SiH)$_x$(CH$_3$Si)$_y$]$_n$. Molecular weight determinations of several preparations ranged from 520–740 g/mol. All products had very similar $^1$H NMR spectra, but with different SiCH$_3$:SiH ratios. Physical data of these products are listed in Table 1.

TABLE 1

PHYSICAL DATA FOR [(CH$_3$SiH)$_x$(CH$_3$Si)$_y$]$_n$ POLYMERS

| Sample # | Polymer Yield (%) | Mol.[a] Weight | SiCH$_3$:SiH[b] | Ceramic[c] Yield (%) | x | y |
|---|---|---|---|---|---|---|
| YFY III-1 | 81 | 600 | 3.74:1 | 20 | 0.80 | 0.20 |
| YFY II-40 | 74 | 740 | 3.56:1 | 16 | 0.84 | 0.16 |
| YFY II-25 | 73 | 650 | 3.51:1 | 26 | 0.85 | 0.15 |
| YFY II-12 | 66 | 520 | 3.27:1 | 16 | 0.91 | 0.09 |
| YFY I-73 | 73 | 680 | 3.48:1 | 27 | 0.86 | 0.14 |

[a]Cryoscopic in benzene.
[b]$^1$H NMR integration ratio.
[c]Under nitrogen gas, 25–1000° C., 10° C./min (TGA)

For the purpose of simplifying calculation, an average formula weight value 44 was assigned for the unit (CH$_3$SiH)$_x$(CH$_3$Si)$_y$. Therefore, in each of the following experiments, the number of moles of the reaction unit (CH$_3$SiH) was calculated from the weight of the polymer used divided by 44.

C. CHARACTERIZATION OF THE POLYCARBOSILANE

The polycarbosilane, a white solid, was purchased from Dow Corning Corporation. The following data were collected on it:

$^1$H NMR (90 MHz, C$_6$D$_6$): δ4.52 (broad, SiH, 1H) 0.26 (broad, SiCH$_3$ and SiCH$_2$Si, 8.6H)

IR (KBr, Nujol, cm$^{-1}$): 2104(s), 1253(s), 1014(s, broad), 845(s, broad), 734(s).

Molecular weight (cryoscopic in benzene): 1210 g/mol TGA (25°–1000° C., 10° C./min): 58% yield of a black ceramic solid. T$_{1/2}$=510° C.

D. PREPARATION OF VINYL-SILICON COMPOUNDS

1. Preparation of [(CH$_3$)(CH$_2$=CH)SiNH]$_3$

A one liter, three-necked, round bottomed flask was equipped with an overhead mechanical stirrer, a cold condenser (dry ice-acetone), and a septum and was flame-dried under a strong flow of nitrogen. Diethyl ether (500 ml) and (CH$_3$)(CH$_2$=CH)SiCl$_2$ (170 ml, 1.31 mol) were cannulated into the flask, which had been cooled to 0° C. with an ice bath. An excess of anhydrous ammonia was bubbled into the reaction mixture over approximately 3 hours with vigorous stirring. The reaction mixture then was stirred at room temperature for 4 hours and subsequently was filtered in the dry box. The residue was washed with several portions of ether. The solvent was removed by trap-to-trap distillation at ca. 0.05 mmHg at room temperature to leave a clear residue (92.3 g, 83%). The product was purified by reduced pressure distillation to give 65.6 g (59%) of [CH$_3$(CH$_2$=CH)SiNH]$_3$ and 9.4 g (8.5%) of [CH$_3$(CH$_2$=CH)SiNH]$_4$. These products were further purified by repeated reduced pressure distillation. [CH$_3$(CH$_2$=CH)SiNH]$_3$, bp 99°-100° C. (5 mmHg).

$^1$H NMR (90 MHz, C$_6$D$_6$): δ5.92 (multiplet, SiCH=CH$_2$, 3H), 0.6 (broad, NH, 1H), 0.15 (multiplet, SiCH$_3$, 3H) (isomers present).

IR (neat, cm$^{-1}$): 3400(s), 3191(w), 3058(s), 3016(m), 2958(s), 2900(w), 1592(s), 1401(s), 1250(s), 1145-1180(s), 1006(s), 902-958(s), 840(s), 780(s), 720(s), 620(s).

Molecular weight (cryoscopic in benzene): 250 g/mol (calcd. 255). n$^{20}$D 1.4830 (n$^{20}$D 1.4810 reported in Andrianov, K. A., et al. *Izv. Akad. Nauk SSSR, Otd. Khim. Nauk,* 948 (1963) and 860 (Eng. Trans) and n$^{20}$D 1.4820 reported by Zhinkin, D. Y., et al., *Zh. Obshch. Khim.* 33:1293 (1963) and 1263 (Eng. Trans.)). [CH$_3$(CH$_2$=CH)SiNH]$_4$, bp 116°-118° C. (3 mmHg).

$^1$H NMR (90 MHz, C$_6$D$_6$): δ6.00 (multiplet, SiCH=CH$_2$, 3H), 0.5 (broad, NH, 1H), 0.16 (multiplet, SiCH$_3$, 3H) (isomers present).

IR (neat, cm$^{-1}$): 3393(s), 3191(w), 3056(s), 3008(w), 2960(s), 2901(w), 1596(s), 1401(s), 1253(s), 1157-1198(s), 1006(s), 915-967(s), 867(s), 785(s), 747(s), 678(m), 610(s).

Molecular weight (cryoscopic in benzene): 320 g/mol n$^{20}$D 1.4962 (reported in Andrianov, supra n$^{20}$D 1.4980.)

In the following experiments, the distilled trimer, [(CH$_3$)(CH$_2$=CH)SiNH]$_3$, was used.

2. Preparation of [(CH$_3$)(CH$_2$=CH)SiO]$_m$ m=4,5,6

A 500 ml three-necked, round-bottomed flask equipped with a stir-bar, a reflux condenser, and a serum cap was charged with 65 ml (0.5 mol) of (CH$_3$)(CH$_2$=CH)SiCl$_2$ and 250 ml of diethyl ether. The solution was cooled to 0° C. (ice-water bath). To the solution was added 10 ml of H$_2$O, slowly by syringe. The ice-water bath was removed and the reaction mixture was stirred at room temperature for 24 hours. Five 200 ml portions of H$_2$O were added to the reaction mixture. The ether layer was washed with two 100 ml portions of H$_2$O and dried over MgSO$_4$. The solvent was removed by rotary evaporation to give 40.5 g of clear oil (94% yield based on [(CH$_3$)(CH$_2$=CH)SiO] unit). Gas chromatographic analysis showed the product to be a mixture of [(CH$_3$)(CH$_2$=CH)SiO]$_m$, where m=4,5,6 (50% m=4, 30% m=5, 10% m=6). No further purification has been attempted, and in the experiments below this mixture of cyclics was used.

Physical data for the mixture:

$^1$H NMR (90 MHz, C$_6$D$_6$): δ 5.97 (multiplet, SiCH=CH$_2$, 1H), 0.27 (broad, singlet, SiCH$_3$, 1H) (isomers present).

IR (neat, cm$^{-1}$): 3050(m), 3012(w), 2958(m), 2944(m), 1915(w), 1592(m), 1401(s), 1253(s), 1075(br,s), 1004(s), 952(s), 790(broad, s), 748(s), 680(m).

The compound where n=4 was collected (preparative GC) and fully characterized:

$^1$H NMR (90 MHz, C$_6$D$_6$): δ 5.95 (multiplet, SiCH=CH$_2$, 1H), 0.26 (multiplet, SiCH$_3$, 1H) (isomers present).

IR (neat, cm$^{-1}$): 3060(m), 3010(w), 2985(m), 1925(w), 1600(m), 1408(s), 1260(s), 1075(br,s), 1008(s), 960(s), 790(s), 748(s).

Mass spectrum: m/e Ion: 329 M$^+$-CH$_3$, 317 M$^+$-CH$_2$=CH, 301 M$^+$-SiCH$_3$, 289 M$^+$-SiCH$_3$CH$_2$=CH, 275 M$^+$-SiCH$_3$O, Anal. Calcd. for Si$_4$C$_{12}$H$_{24}$O$_4$: C, 41.86; H, 7.02; Found: C, 41.97; H, 7.12

The hydrolyses of methylvinyldichlorosilane and of methylvinyldiethoxysilane have been described in Kantor, S. W. et al., *J. Am. Chem. Soc.,* 77:1685 (1955); Hurd, D. T., *J. Am. Chem. Soc.,* 67:1812 (1945) which are incorporated herein by reference and the cyclic tetramer, pentamer and hexamer have been characterized as pure compounds.

3. Preparation of [(CH$_3$)(CH$_2$=CH)SiS]$_3$

A 250 ml Schlenk flask equipped with a stir-bar and a serum cap was charged with 2.3 g (0.07 mol) of sulfur powder and 20 ml of THF. To the sulfur suspension 140 ml of LiBEt$_3$H solution (1M solution of THF, 0.14 mol, 2 equivalents) was added slowly by syringe (Gladysz, J. A. et al., *Tetrahedron,* 35:2329 (1979)). A reaction occurred immediately and the solution color changed from dark brown to yellow. The reaction mixture was stirred at room temperature for 1 hour. To the resulting yellow solution was added 10 ml (0.077 mol) of (CH$_3$)(CH$_2$=CH)SiCl$_2$ slowly by syringe. A reaction occurred immediately and the yellow solution turned cloudy. The reaction mixture was stirred at room temperature overnight. Solvent was removed by trap-to-trap distillation. The residue was extracted with 60 ml of hexane and the mixture was centrifuged. The supernatant liquid was transferred by cannula into a weighed 100 ml round-bottomed flask. Solvent again was removed by trap-to-trap distillation to give 5.4 g (75% yield) of a yellow oil.

$^1$H NMR (90 MHz, C$_6$D$_6$): δ 5.93 (multiplet, SiCH=CH$_2$, 1H) 0.67 (multiplet, SiCH, 1H) (isomers present).

IR (neat, cm$^{-1}$): 3050(m), 3001(w), 2942(m), 1911(w), 1585(m), 1398(s), 1245(s), 1040(m), 998(s), 952(s), 780(s), 725(s), 651(s), 542(s).

Mass Spectrum: m/e Ion: 306 M$^+$, 291 M$^+$-CH$_3$, 279 M$^+$-CH$_2$=CH 252 M$^+$-2(CH$_2$=CH)

1,3,5-Trimethyl-1,3,5-trivinylcyclotrisilthiane has been prepared previously by the reaction of (CH$_3$)(CH$_2$=CH)SiCl$_2$ with H$_2$S in the presence of pyridine. More than one isomer was determined to be present (Millard, M. M. et al., *J. Organomet. Chem.,* 52:283 (1973)).

E. HYDROSILYLATION REACTION OF [(CH$_3$SiH)$_x$(CH$_3$Si)$_y$]$_n$ with [(CH$_3$)(CH$_2$=CH)SiNH]$_3$ Initiated by AIBN The same general procedure was used for all of these reactions. In a dry box, a 100 ml three-necked, round-bottomed flask equipped with a stir-bar, a reflux condenser and a serum cap was charged with 1.89 g (0.043 mol) of [(CH$_3$SiH)$_x$(CH$_3$Si)$_y$]$_n$ (II-12). The flask was removed from the dry box and attached to a Schlenk manifold under nitrogen. Benzene (40 ml) was added by syringe to give a clear, colorless solution. AIBN (0.05 g, 0.30 mmol) was added as the solid against a countercurrent stream of nitrogen. The solution was stirred at room temperature for 5 minutes to dissolve the AIBN. To the solution was added 0.63 g (2.5 mmol, 7.5 mmol of SiCH=CH$_2$ unit) of [(CH$_3$)(CH$_2$=CH)SiNH]$_3$. The resulting solution was heated gently at reflux for 20 minutes. This solution should not be heated for more than 30 minutes or an insoluble polymer will form. Alternatively, a somewhat lower reaction temperature may be used. The reaction mixture was allowed to cool to room temperature. The solvent was removed by trap-to-trap distillation to give 2.49 g (ca. quantitative yield) of a white powder identified as [(CH$_3$SiH)$_{0.73}$(CH$_3$Si)$_{0.1}$(CH$_3$SiCH$_2$CH$_2$Si(CH$_3$)NH)$_{0.17}$] on the basis of the following data. The polymer is soluble in hexane, benzene, and THF.

$^1$H NMR (90 MHz, C$_6$D$_6$): δ 4.04 (broad, SiH, 1H), 1.06 (singlet, SiCH$_2$CH$_2$Si), 0.44 (broad, SiCH$_3$, 5.9H for the total area of SiCH$_2$CH$_2$Si and SiCH$_3$).

Molecular weight (cryoscopic in benzene): 2100 g/mol

TGA (25°–1000° C., 10° C./min): 77% yield of a black ceramic solid

Anal. Calcd. for C$_1$Si$_{0.77}$H$_{3.37}$N$_{0.11}$: C, 31.21; H, 8.76; Si, 56.03; N, 4.00; Found: C, 31.30; H, 8.02; Si, 53.92; N, 4.05 (Total: 97.29%)

The polymer is given a formula [(CH$_3$SiH)$_{x'}$(CH$_3$Si)$_y$(CH$_3$SiCH$_2$CH$_2$Si(CH$_3$)NH)$_z$] (x'+y+z=1). Assuming that (CH$_3$Si)$_y$ unit is not involved in the hydrosilylation reaction, therefore, the y value should be the same as that in the starting material, [(CH$_3$SiH)$_x$(CH$_3$Si)$_y$]$_n$. From this formula, the sum of 3x', 3y, and 11z divided by x' should be equal to the integrated ratio of SiCH$_3$ area and SiH area obtained from its $^1$H NMR spectrum. In this case, the calculated values of x'=0.73 and z=0.17.

Ceramic Analyses: Large scale pyrolysis of a sample under N$_2$. (25°–1000° C., 10° C./min) (60–68% ceramic yield).

Residue found: C, 27.70; H, 0.18; Si, 68.36; N, 4.11. (Total: 100.35%).

This leads to a calculated composition: 0.033 Si$_3$N$_4$+1SiC+0.04 C (equivalent to 1.0 weight percent of free carbon).

A sample for X-ray powder diffraction was pyrolyzed in a tube furnace up to 1500° C. under a nitrogen atmosphere. The diffraction pattern showed only very broad peaks for β—SiC with no Si$_3$N$_4$ or free Si peaks. X-ray powder diffraction (d$_o$, A): 2.55(s), β—SiC, 2.47(s), β—SiC, 1.53(w), β—SiC.

Using the general procedure as described above, reactions between [(CH$_3$SiH)$_x$(CH$_3$Si)$_y$]$_n$ with different quantities of [(CH$_3$)(CH$_2$=CH)SiNH]$_3$ in different solvents were carried out. The preceramic polymers produced are set forth in Tables 2 and 3.

TABLE 2

Hydrosilylation Reactions of [(CH$_3$SiH)$_x$(CH$_3$Si)$_y$]$_n$ with [(CH$_3$)(CH$_2$=CH)SiNH]$_3$$^a$

| Sample Number | Solvent | Mole Ratio of SiH:SiCH=CH$_2$ | Reflux Time (Min.) | Polymer Solubility$^b$ |
|---|---|---|---|---|
| YFY-II-14 | Benzene | 2:1 | 120 | Insoluble |
| YFY-II-18 | Benzene | 3:1 | 10 | Insoluble |
| YFY-II-18-1 | Benzene | 3:1 | 5 | Soluble |
| YFY-II-19 | Benzene | 6:1 | 30 | Slightly Soluble |
| YFY-II-26 | Benzene | 6:1 | 20 | Soluble |
| YFY-II-17 | Benzene | 6:1 | 10 | Soluble |
| YFY-II-21 | Hexane | 6:1 | 40 | Soluble |
| YFY-III-54 | Cyclohexane | 6:1 | 20 | Soluble |
| YFY-III-45 | Benzene | 8:1 | 20 | Soluble |
| YFY-III-46 | Benzene | 10:1 | 120 | Soluble |
| YFY-II-15 | Benzene | 12:1 | 150 | Soluble |

$^a$All of these reactions give quantitative yield.
$^b$Solubility of the polymer in hexane, benzene and THF.

TABLE 3

Physical Data of the Soluble Polymers Listed in Table 2

| Sample Number | TGA, Ceramic Yield$^a$ (%) | T$_{\frac{1}{2}}^b$ (°C.) | Molecular$^c$ Weight (g/mol) | $^1$H NMR$^d$ Integration Ratio |
|---|---|---|---|---|
| YFY-II-26 | 77 | 400 | 2100 | 1:5.9 |
| YFY-II-17 | 68 | 400 | 2120 | 1:6.0 |
| YFY-III-45 | 45 | 350 | 2040 | 1:6.9 |
| YFY-III-46 | 50 | 350 | 1550 | 1:6.5 |
| YFY-II-15 | 61 | 350 | 940 | 1:5.1 |
| YFY-II-21 | 60 | 410 | — | — |
| YFY-III-54 | 53 | 420 | — | 1:6.1 |

$^a$Under nitrogen, 25–1000° C., 10° C./min.
$^b$Temperature at which one-half of the total weight loss had taken place.
$^c$Cryoscopic in benzene.
$^d$Ratio of SiH:(SiCH$_2$CH$_2$Si, SiCH$_3$ and NH).

F. HYDROSILYLATION REACTION OF [(CH$_3$SiH)$_x$(CH$_3$Si)$_y$]$_n$ WITH [(CH$_3$)(CH$_2$=CH)SiO]$_m$ (m=4,5,6) INITIATED BY AIBN

According to the procedure described previously, the reaction between [(CH$_3$SiH)$_x$(CH$_3$Si)$_y$]$_n$ (1.2 g, 0.027 mol, II-40), 0.05 g (0.30 mmol) of AIBN, and 0.4 g (0.0045 mol of (CH$_2$=CH)SiCH$_3$O unit) of [(CH$_3$)(CH$_2$=CH)SiO]$_m$ in 20 ml of benzene was carried out under a nitrogen atmosphere. The reaction mixture was heated gently at reflux for 10 minutes and then was allowed to cool to room temperature and stirred for an additional hour. The solvent was removed by trap-to-trap distillation to give 1.57 g (98% by weight) of a white powder. The polymer was assigned the formula [(CH$_3$SiH)$_{0.67}$(CH$_3$Si)$_{0.16}$(CH$_3$SiCH$_2$CH$_2$Si(CH$_3$)O)$_{0.17}$] on the basis of the following data. The polymer is soluble in hexane, benzene and THF.

$^1$H NMR (90 MHz, C$_6$D$_6$): δ 4.03 (broad, SiH, 1H), 1.06 (singlet, SiCH$_2$CH$_2$Si), 0.44 (broad, SiCH$_3$, 6.2H for total area of SiCH$_2$CH$_2$Si and SiCH$_3$).

Molecular weight: 3500 g/mol.

TGA (25°–1000° C., 10° C./min): 73% yield of a black ceramic solid.

Using the same general procedure as outlined above, other reactions between [(CH$_3$SiH)$_x$(CH$_3$Si)$_y$]$_n$ with [(CH$_3$)(CH$_2$=CH)SiO]$_m$ in different mole ratios were carried out. The preceramic polymers produced are described in Tables 4 and 5.

Ceramic Anal.: Large scale pyrolysis of a sample under N$_2$ (25°–1000° C., 10° C./min) (69% ceramic yield).

Residue found: C, 29.65; H, 0.31; Si, 62.71; O, 7.25; Total: 99.9%

This leads to a calculated composition: 1SiC+0.11SiO$_2$+0.23C.

TABLE 4

Hydrosilylation Reactions of $[(CH_3SiH)_x(CH_3Si)_y]_n$ with $[(CH_3)(CH_2=CH)SiO]_m{}^a$

| Sample Number | Solvent | Mole Ratio of SiH:SiCH=CH$_2$ | Reflux Time (Min.) | Polymer Solubility[b] |
|---|---|---|---|---|
| YFY-II-60 | Benzene | 12:1 | 300 | Soluble |
| YFY-II-67 | Benzene | 9:1 | 120 | Soluble |
| YFY-II-61 | Benzene | 6:1 | 10 | Soluble |
| YFY-II-62 | Benzene | 3:1 | 11 | Insoluble |

[a] All of these reactions give quantitative yield.
[b] Solubility of the polymer in hexane, benzene and THF.

TABLE 5

Physical Data of the Soluble Polymers Listed in Table 4

| Sample Number | TGA, Ceramic Yield[a] (%) | $T_{\frac{1}{2}}{}^{b}$ (°C.) | Molecular Weight (g/mol) | $^1$H NMR[c] Integration Ratio |
|---|---|---|---|---|
| YFY-II-60 | 60[d] | — | 1900 | 1:6.2 |
| YFY-II-67 | 63[d] | — | 3100 | 1:6.6 |
| YFY-II-61 | 73 | 370 | 3500 | 1:6.2 |

[a] Under nitrogen, 25–1000° C., 10° C./min.
[b] Temperature at which one-half of the total weight loss had taken place.
[c] Ratio of SiH:(SiCH$_2$CH$_2$Si and SiCH$_3$).
[d] Under nitrogen in a tube furnace.

G. HYDROSILYLATION REACTION OF $[(CH_3SiH)_x(CH_3Si)_y]_n$ WITH $[(CH_3)(CH_2=CH)SiS]_3$ INITIATED BY AIBN

According to the procedure described previously, the reaction between $[(CH_3SiH)_x(CH_3Si)_y]_n$ (1.1 g, 0.025 mol, II-40), 0.05 g (0.30 mmol) of AIBN, and 0.43 g (0.0042 mol) of $[(CH_3)(CH_2=CH)SiS]_3$ in 40 ml of benzene was carried out under a nitrogen atmosphere. The reaction mixture was heated gently at reflux for 10 minutes and then was allowed to cool to room temperature and stirred for an additional hour. The solvent was removed under reduced pressure to give 1.47 g (97% by weight) of a white powder. The polymer was assigned the formula $[(CH_3SiH)_{0.67}(CH_3Si)_{0.16}$—$(CH_3SiCH_2CH_2SiCH_3S)_{0.17}]$ on the basis of the following data. The polymer is soluble in hexane, benzene and THF.

$^1$H NMR (90 MHz, C$_6$D$_6$): δ 3.98 (broad, SiH, 1H), 1.22 (singlet, SiCH$_2$CH$_2$Si), 0.39 (broad, SiCH$_3$, 6.5H for total area of SiCH$_2$CH$_2$Si and SiCH$_3$).

Molecular weight (cryoscopic in benzene): 3000 g/mol

TGA (25°–1000° C., 10° C./min): 60% yield of a black ceramic solid.

Ceramic Anal.: Large scale pyrolysis of the sample under N$_2$ (25°–1000° C., 10° C./min) (57% ceramic yield).

Found: C, 24.42; H, 0.58; Si, 60.44; S, 1.45. Total: 86.89%

Using the same general procedure as outlined above, other reactions between $[(CH_3SiH)_x(CH_3Si)_y]_n$ with $[(CH_3)$—$(CH_2=CH)SiS]_3$ in different mole ratios were carried out. The preceramic polymers produced are tabulated in Tables 6 and 7.

TABLE 6

Hydrosilylation Reactions of $[(CH_3SiH)_x(CH_3Si)_y]_n$ with $[(CH_3)(CH_2=CH)SiS]_3{}^a$

| Sample Number | Solvent | Mole Ratio of SiH:SiCH=CH$_2$ | Reflux Time (Min.) | Polymer Solubility[b] |
|---|---|---|---|---|
| YFY-II-66 | Benzene | 12:1 | 1200 | Soluble |
| YFY-II-65 | Benzene | 6:1 | 10 | Soluble |
| YFY-II-68 | Benzene | 6:1 | 20 | Soluble |
| YFY-II-69 | Benzene | 4.5:1 | 6 | Insoluble |

[a] All of these reactions give quantitative yield.
[b] Solubility of the polymer in hexane, benzene and THF.

TABLE 7

Physical Data of the Soluble Polymers Listed in Table 6

| Sample Number | TGA, Ceramic Yield[a] (%) | $T_{\frac{1}{2}}{}^{b}$ (°C.) | Molecular Weight (g/mol) | $^1$H NMR[c] Integration Ratio |
|---|---|---|---|---|
| YFY-II-66 | 50 | 340 | 2100 | 1:6.5 |
| YFY-II-65 | 60 | 390 | 2900 | 1:6.5 |
| YFY-II-68 | 60 | 390 | 2800 | 1:6.6 |

[a] Under nitrogen, 25–1000° C., 10° C./min.
[b] Temperature at which one-half of the total weight loss had taken place.
[c] Ratio of SiH:(SiCH$_2$CH$_2$Si, SiCH$_3$).

H. HYDROSILYLATION REACTION OF $[(CH_3SiH)_x(CH_3Si)_y]_n$ WITH $[(CH_2=CH)Si(CH_3)_2]_2NH$ INITIATED BY AIBN

According to the procedure described previously, the reaction between $[(CH_3SiH)_x(CH_3Si)_y]_n$ (1.1 g, 0.025 mol, II-40), 0.05 g (0.30 mmol) of AIBN, and 1.4 ml (0.012 mol of Si(CH=CH$_2$) unit) of $[(CH_2=CH)Si(CH_3)_2]_2NH$ in 40 ml of benzene was carried out under a nitrogen atmosphere. The reaction mixture was heated gently at reflux for 24 hours and then was allowed to cool to room temperature. The solvent was removed under reduced pressure to give 2.14 g (95% by weight) of a white powder. The polymer was assigned the formula $[(CH_3SiH)_{0.54}(CH_3Si)_{0.16}(CH_3SiCH_2CH_2Si$—$(CH_3)_2)_2NH)_{0.30}]$ on the basis of the following data. The polymer is soluble in hexane, benzene and THF.

$^1$H NMR (90 MHz, C$_6$D$_6$): δ 3.93 (broad, SiH, 1H), 0.11–1.12 (broad, SiCH$_3$, SiCH$_2$CH$_2$, NH 18H for the total area).

Molecular weight (cryoscopic in benzene): 1500 g/mol.

TGA (25°–1000° C., 10° C./min): 28% yield of a black ceramic solid.

Anal. Calcd. for C$_1$Si$_{0.51}$H$_{2.9}$N$_{0.08}$: C, 39.46; H, 9.53; Si, 46.95; N, 3.73. Found: C, 41.29; H, 9.08; Si, 46.25; N, 3.88. Total: 100.5%

Using the same general procedure as outlined above, other reactions between $[(CH_3SiH)_x(CH_3Si)_y]_n$ with $[(CH_2=CH)Si(CH_3)_2]_2NH$ in different mole ratios were carried out. The preceramic polymers produced are set forth in Tables 8 and 9.

TABLE 8

Hydrosilylation Reactions of $[(CH_3SiH)_x(CH_3Si)_y]_n$ with $[(CH_2=CH)Si(CH_3)_2]_2NH^a$

| Sample Number | Solvent | Mole Ratio of SiH:SiCH=CH$_2$ | Reflux Time (Hrs.) | Polymer Solubility[b] |
|---|---|---|---|---|
| YFY-II-50 | Benzene | 2:1 | 24 | Soluble |
| YFY-II-52 | Benzene | 3:1 | 20 | Soluble |
| YFY-II-55 | Toluene | 3:1 | 20 | Soluble |
| YFY-II-54 | Benzene | 4.5:1 | 24 | Soluble[c] |

TABLE 8-continued
Hydrosilylation Reactions of $[(CH_3SiH)_x(CH_3Si)_y]_n$ with $[(CH_2{=}CH)Si(CH_3)_2]_2NH^a$

| Sample Number | Solvent | Mole Ratio of SiH:SiCH=CH$_2$ | Reflux Time (Hrs.) | Polymer Solubility[b] |
|---|---|---|---|---|
| YFY-II-53 | Benzene | 6:1 | 20 | Soluble[c] |

[a]All of these reactions give quantitative yield.
[b]Solubility of the polymer in hexane, benzene and THF.
[c]Gummy solid.

TABLE 9
Physical Data of the Soluble Polymers Listed in Table 8

| Sample Number | TGA, Ceramic Yield[a] (%) | Molecular Weight (g/mol) |
|---|---|---|
| YFY-II-50 | 28 | 1500 |
| YFY II-52 | 32[b] | 1120 |
| YFY-II-55 | 32[b] | 1350 |

[a]Under nitrogen, 25–1000° C., 10° C./min.
[b]Under nitrogen in a tube furnace.

I. HYDROSILYLATION REACTION OF $[(CH_3SiH)_x(CH_3Si)_y]_n$ WITH $(CH_2{=}CH)_2C_6H_4$ INITIATED BY AIBN

According to the procedure described previously, the reaction between $[(CH_3SiH)_x(CH_3Si)_y]_n$ (1.1 g, 0.25 mole, II-40, 0.05 g (0.30 mmol) of AIBN, and 0.6 ml (0.0084 mole of (CH=CH$_2$) unit) of divinylbenzene (58.5% para, 40% meta, trace ortho; bp 60°–63° C./5 mmHg) in 20 ml of benzene was carried out under a nitrogen atmosphere. The resulting solution was heated gently at reflux for 40 hours and then was allowed to cool to room temperature. The solvent was removed by trap-to-trap distillation to give 1.57 g (95% by weight) of a white powder. The polymer was assigned the formula $[(CH_3SiH)_{0.67}(CH_3Si)_{0.16}(CH_3SiCH_2)_2C_6H_4)_{0.17}]$ on the basis of its $^1H$ NMR spectrum.

$^1H$ NMR (90 MHz, C$_6$D$_6$): δ 7.14 (broad, C$_6$H$_4$, 1.1.H), 3.94 (broad, SiH, 1H), 2.50 (broad, SiCH$_2$CH$_2$—C$_6$H$_4$, 0.9H), 0.26–1.11 (broad, SiCH$_3$, SiCH$_2$, 6H).

Molecular weight (cryoscopic in benzene): 1500 g/mol.

TGA (25°–1000° C., 10° C./min): 55% yield of a black ceramic solid, T$_{\frac{1}{2}}$=410° C.

Ceramic Anal.: Large scale pyrolysis of the sample under N$_2$ (25°–1000° C., 10° C./min) (52% ceramic yield). Found: C, 51.70; H, 0.54; Si, 46.48; Total: 98.72%; Composition: SiC+1.6C Using the same general procedure as outlined above, other reactions between $[(CH_3SiH)_x(CH_3Si)_y]_n$ with $(CH_2{=}CH)_2C_6H_4$ in different mole ratios were carried out. The preceramic polymers produced are tabulated in Tables 10 and 11.

TABLE 10
Hydrosilylation Reaction of $[(CH_3SiH)_x(CH_3Si)_y]_n$ with $[(CH_2{=}CH)_2C_6H_4]^a$

| Sample Number | Solvent | Mole Ratio of SiH:SiCH=CH$_2$ | Reflux Time (Hrs.) | Polymer Solubility[b] |
|---|---|---|---|---|
| YFY-II-43 | Benzene | 6:1 | 40 | Soluble |
| YFY-II-44 | Benzene | 3:1 | 40 | Soluble |
| YFY-II-45 | Benzene | 2:1 | 20 | Soluble |
| YFY-II-51 | Benzene | 2:1 | 40 | Insoluble |
| YFY-II-47 | Toluene | 2:1 | 20 | Soluble |
| YFY-II-44-1 | Hexane | 2:1 | 16 | Liquid |
| YFY-II-44-2 | Hexane | 1:1 | 16 | Insoluble |

TABLE 10-continued
Hydrosilylation Reaction of $[(CH_3SiH)_x(CH_3Si)_y]_n$ with $[(CH_2{=}CH)_2C_6H_4]^a$

| Sample Number | Solvent | Mole Ratio of SiH:SiCH=CH$_2$ | Reflux Time (Hrs.) | Polymer Solubility[b] |
|---|---|---|---|---|
| YFY-II-49 | Benzene | 1:1 | 24 | Soluble |

[a]All of these reactions give quantitative yield.
[b]Solubility of the polymer in hexane, benzene and THF.

TABLE 11
Physical Data of the Soluble Polymers Listed in Table 10

| Sample Number | TGA, Ceramic Yield[a] (%) | T$_{\frac{1}{2}}$[b] (°C.) | Molecular[c] Weight (g/mol) | $^1$HNMR[d] Integration Ratio |
|---|---|---|---|---|
| YFY-II-44 | 55 | 410 | 1500 | 1.1:0:1:0.9:5.6 |
| YFY-II-45 | 48 | 400 | 1100 | 1.4:0.1:1:1:6.2 |
| YFY-II-49 | 54 | 460 | 840 | 2:0.5:1:1:5.9 |

[a]Under nitrogen, 25–1000° C., 10° C./min.
[b]Temperature at which one-half of the total weight loss had taken place.
[c]Cryoscopic in benzene.
[d]Ratio of SiC$_6$H$_4$:CH$_2$=CH:SiH:SiCH$_2$CH$_2$C$_6$H$_4$:(SiCH$_3$ and SiCH$_2$).

J. HYDROSILYLATION REACTION OF $[(CH_3SiH)_x(CH_3Si)_y]_n$ WITH POLYBUTADIENE INITIATED BY AIBN

According to the procedure described previously, the reaction between $[(CH_3SiH)_x(CH_3Si)_y]_n$ (2.2 g, 0.05 mol, II-22), 0.05 g (0.30 mmol) of AIBN, and 0.6 g (0.005 mol of CH$_2$=CH unit) of polybutadiene (Aldrich #20050-6, containing 45% vinyl, 55% 1,4) in 40 ml of benzene was carried out under a nitrogen atmosphere. The reaction mixture was heated gently at reflux for 90 minutes and then was allowed to cool to room temperature. The solvent was removed by trap-to-trap distillation to give 2.74 g (98% by weight) of a white powder.

$^1$H NMR (90 MHz, C$_6$D$_6$): δ5.30 (broad, CH$_2$=CH, 0.2H), 4.00 (broad, SiH, 1H), 1.55, 1.07 (singlet, CH$_2$ of polybutadiene), 0.44, 0.27 (broad, SiCH$_3$, 6H for total area of SiCH$_2$CH$_2$Si, benzene at the freezing point. SiCH$_3$, and CH$_2$).

Molecular weight (cryoscopic in benzene): Not soluble enough in benzene at the freezing point.

TGA (25°–1000° C., 10° C./min): 47% yield of a black ceramic solid, T$_{\frac{1}{2}}$=380° C.

K. HYDROSILYLATION REACTION OF POLY(PHENYLSILYLENE) WITH $[(CH_3)(CH_2{=}CH)NH]_3$ INITIATED BY AIBN

Poly(phenylsilylene), $[C_6H_5SiH]_n$, was prepared by the method described by Aitken, C., supra.

$[(CH_3)(CH_2{=}CH)SiNH]_3$ (0.38 g, 1.5 mmol), AIBN (0.01 g) and 5 ml of benzene were placed in a 50 ml three-necked flask equipped with a reflux condenser, $[C_6H_5SiH]_n$ (0.47 g, 0.55 mmol) was added under nitrogen and the resulting solution was stirred at 60° C. for 30 minutes. Subsequently, the solvent was removed in vacuo overnight to leave 0.71 g (84%) of a colorless, viscous oil.

$^1$H NMR (C$_6$D$_6$): δ0–1.2 (broad, SiCH$_3$ and NH, 0.72H), 4.5–5.4 (broad, SiH, 0.23H), 5.6–6.3 (m, vinyl CH, 0.4H), 6.5–7.6 (SiC$_6$H$_5$, 1H)

Molecular weight (cryoscopic in benzene): 620 g/mol.

TGA (25°–950° C., 10° C./min): 70% black solid.

Various reactions of this kind were carried out in which the $[(CH_3)(CH_2{=}CH)SiNH]_3/[C_6H_5SiH]_n$ mole ratio was varied between 2.7 and 8 and the reaction time at 60° C. between 30 minutes to up to 24 hours. The products were viscous oils with molecular weight between 440 and 730, with one exception. Use of a ratio of 2.7 and a heating time of 24 hours gave a white solid product, molecular weight 1300.

The ceramic yields (TGA to 1000° C.) of all of these products varied between 67 and 75%.

A large scale reaction (ratio as defined above 2.9, 24 hours at 60° C., with 0.025 g AIBN, in benzene) gave a white solid, molecular weight 1260, in 87% yield. Analysis Found: C, 54.24; H, 6.74; N, 4.80; Si, 29.03%

A 2.52 g sample was pyrolyzed under argon to 1000° C. in a tube furnace to give a black ceramic material in 68% yield. Analysis Found: C, 51.08; H, 0.62; N, 10.55; Si, 37.90%.

L. HYDROSILYLATION REACTION OF $[(CH_3SiH)_x(CH_3Si)_y]_n$ WITH $[(CH_3)(CH_2=CH)SiNH]_3$

1. Initiated by AIBN with UV Irradiation

In a dry box, a 100 ml round-bottomed quartz flask equipped with a stir-bar was charged with 2.2 g (0.05 mol) of $[(CH_3SiH)_x(CH_3Si)_y]_n$ (III-1) and 0.05 g (0.30 mmol) of AIBN. Benzene (50 ml) was added to dissolve the polymer and the catalyst. To the solution was added 0.71 g (0.0028 mol) of $[(CH_3)(CH_2=CH)SiNH]_3$. The resulting solution then was photolyzed for 45 minutes. The solvent was removed by trap-to-trap distillation to give 2.88 g (99% by weight) of a white powder. The polymer is only moderately soluble in benzene.

$^1$H NMR (90 MHz $C_6D_6$): δ3.98 (broad, SiH, 1H), 1.06 (singlet, SiCH$_2$CH$_2$Si), 0.45 (broad, SiCH$_3$, 6.5H for the total area of SiCH$_2$CH$_2$Si and SiCH$_3$).

Molecular weight: not soluble enough in benzene.

TGA (25°-1000° C., 10° C./min): 54% yield of a black ceramic solid, $T_{\frac{1}{2}}=400°$ C.

2. With UV Irradiation (no AIBN)

In a dry box, 100 ml round-bottomed flask equipped with a stir-bar was charged with 1.1 g (0.025 mol) of $[(CH_3SiH)_x(CH_3Si)_y]_n$ (III-53, x=0.78, y=0.22). Benzene (50 ml) was added to dissolve the polymer. To the solution was added 0.17 g (0.67 mmol) of $[(CH_3)(CH_2=CH)SiNH]_3$. The resulting solution then was photolyzed for 30 minutes. The solvent was removed by trap-to-trap distillation to give 1.23 g (97% by weight) of a white powder. The polymer is only moderately soluble in benzene.

$^1$H NMR (90 MHz, $C_6D_6$): δ4.01 (broad, SiH, 1H), 1.06 (singlet, SiCH$_2$CH$_2$Si), 0.46 (broad, SiCH$_3$, 6H for the total area of SiCH$_2$CH$_2$Si and SiCH$_3$).

Molecular weight (cryoscopic in benzene): 1650 g/mol.

TGA (25°-1000° C., 10° C./min.): 59% yield of a black ceramic solid, $T_{178}=350°$ C.

M. HYDROSILYLATION REACTION OF $[(CH_3SiH)_x(CH_3Si)_y]_n$ with $[(CH_3)(CH_2=CH)SiNH]_3$ INITIATED BY BENZOYL PEROXIDE Essentially the same procedure was used in the reaction of $[(CH_3SiH)_x(CH_3Si)_y]_n$ (2.2 g, 0.050 mol, III-53), $[(CH_3)(CH_2=CH)SiNH]_3$ (0.70 g, 0.008 mol of SiCH=CH$_2$ unit), and 0.05 g of $(C_6H_5COO)_2$ (0.21 mmol) in 5 ml of benzene. The resulting solution was heated at reflux for 9 minutes under nitrogen. The solvent was removed by trap-to-trap distillation to give 2.85 g (98% by weight) of a white powder.

$^1$H NMR (90 MHz, $C_6D_6$): δ4.01 (broad, SiH, 1H), 0.47 (broad, SiCH$_2$CH$_2$Si and SiCH$_3$, 6.75H for the total area).

Molecular weight (cryoscopic in benzene): 1060 g/mol.

TGA (25°-1000° C., 10° C./min): 60% yield of a black ceramic solid, $T_{178}=400°$ C.

Longer heating times gave insoluble products.

N. HYDROSILYLATION REACTION OF $[(CH_3SiH)_x(CH_3Si)_y]_n$ WITH $[(CH_3)(CH_2=CH)SiNH]_3$ CATALYZED BY $H_2PtCl_6.6H_2O$

A mixture of $[(CH_3SiH)_x(CH_3Si)_y]_n$ (2.2 g, 0.050 mol, III-53), $[(CH_3)(CH_2=CH)SiNH]_3$ (0.7 g, 0.008 mol of SiCH=CH$_2$ unit), and 50 l of $H_2PtCl_6.6H_2O$ catalyst solution (1 g in 20 ml isopropyl alcohol) in 50 ml of benzene was heated at reflux for 18 hours. The solvent was removed by trap-to-trap distillation to give 2.75 g (95% by weight) of a light yellow solid.

$^1$H NMR (90 MHz, $C_6D_6$): δ4.04 (broad, SiH, 1H), 1.19 (broad, SiCH$_2$CH$_2$Si), 0.49 (broad, SiCH$_3$, 6.6H for the total area of SiCH$_2$CH$_2$Si and SiCH$_3$).

Molecular weight (cryoscopic in benzene): 2500 g/mol.

TGA (25°-1000° C., 10° C./min): 57% yield of a black ceramic solid, $T_{178}=400°$ C.

Using the same procedure as outlined above, the reactions between $[(CH_3SiH)_x(CH_3Si)_y]_n$ and $[(CH_3)(CH_2=CH)SiNH]_3$ in different mole ratios were carried out. The preceramic polymers produced are described in Table 12.

TABLE 12

Hydrosilylation Reactions of $[(CH_3SiH)_x(CH_3Si)_y]_n$ with $[(CH_3)(CH_2=CH)SiNH]_3$ Initiated by $H_2PtCl_6.6H_2O^a$

| Sample Number | Solvent | Molar Ratio of SiH:SiCH=CH$_2$ | Reaction Conditions | Polymer Solubility[b] | Ceramic Yield (TGA) (%) | $T_{\frac{1}{2}}$ (°C.) |
|---|---|---|---|---|---|---|
| YFY-I-76-I | Xylene | 8:1 | Reflux 24 hours | Soluble Gummy Solid | 57 | 330 |
| YFY-I-79 | Benzene | 6:1 | Room Temp. 48 hours | Soluble Viscous Oil | 68 | 410 |
| YFY-III-70 | Benzene | 6:1 | Reflux 18 hours | Soluble Solid | 57 | 400 |
| YFY-II-1 | Xylene | 6:1 | Room Temp. 48 hours | Soluble Viscous Oil | 58 | 400 |
| YFY-II-11 | Benzene | 3:1 | Room Temp. 24 hours | Soluble Viscous Oil | 58 | 410 |
| YFY-II-6 | Xylene | 1:1 | Reflux 24 hours | Insoluble | — | — |

TABLE 12-continued

Hydrosilylation Reactions of $[(CH_3SiH)_x(CH_3Si)_y]_n$ with $[(CH_3)(CH_2{=}CH)SiNH]_3$ Initiated by $H_2PtCl_6{\cdot}6H_2O^a$

| Sample Number | Solvent | Molar Ratio of SiH:SiCH=CH$_2$ | Reaction Conditions | Polymer Solubility[b] | Ceramic Yield (TGA) (%) | $T_{\frac{1}{2}}$ (°C.) |
|---|---|---|---|---|---|---|
| YFY-II-8-1 | Hexane | 1:1 | Room Temp. 24 hours | Soluble Viscous Oil | 72 | 500 |

[a]All of these reactions give quantitative yield.
[b]Solubility of the polymer in hexane, benzene and THF.

O. HYDROSILYLATION REACTION OF POLYCARBOSILANE WITH $[(CH_3)(CH_2{=}CH)SiNH]_3$ INITIATED BY AIBN (IV-8)

The same general procedure was used for all of these reactions. In a dry box, a 100 ml three-necked, round bottomed flask equipped with a stir-bar, a reflux condenser and a serum cap was charged with 3.5 g of the polycarbosilane. The flask was removed from the dry box and attached to a Schlenk manifold under nitrogen. Benzene (40 ml) was added by syringe to give a clear, colorless solution. AIBN (0.05 g, 0.30 mmol) was added as a solid against a counter current stream of nitrogen. The solution was stirred at room temperature for 5 minutes to dissolve the AIBN. To that solution was added 0.5 g (2.0 mmol, 6.0 mmol of Si—(CH=CH$_2$) unit) of $[(CH_3)(CH_2{=}CH)SiNH]_3$. The resulting solution was heated at reflux temperature for 24 hours. The reaction mixture was allowed to cool to room temperature. The solvent was removed by trap-to-trap distillation to give 3.95 g (99% yield by weight) of a white powder. The polymer is soluble in hexane, benzene, and THF. The TGA curve is shown in FIG. 1.

$^1$H NMR (90 MHz, C$_6$D$_6$): δ5.94 (multiplet, SiCH=CH$_2$, 0.6H), 4.51 (broad, SiH, 1H), 0.84 (singlet, SiCH$_2$CH$_2$Si), 0.25, 0.16 (broad, SiCH$_3$ and SiCH$_2$Si, 8.5H for the total area of SiCH$_2$CH$_2$Si, SiCH$_3$ and SiCH$_2$Si).

Molecular weight (cryoscopic in benzene): 1350 g/mol.

TGA (25°–1000° C., 10° C./min): 79% of a black ceramic solid.

Melting point (sealed capillary under vacuum): softens at 145° C., melts at 160°–170° C.

Analysis: Found: C, 29.70; H, 8.03; Si, 60.13; N, 1.80; 0, 0.66. Total: 100.32%

Large scale pyrolysis of a sample under argon gave a 76% yield of a black ceramic solid (25°–1000° C., 10° C./min).

Analysis: Found: C, 36.70; H, 0.71; Si, 61.07; N,, 0.36; O, 1.44. Total: 100.28%

Composition: 1SiC+0.45C+0.003Si$_3$N$_4$+0.02SiO$_2$ (equivalent to 11.3 weight % of free carbon)

Using the same general procedure as outlined above, other reactions between the polycarbosilane with different quantities of $[(CH_3)(CH_2{=}CH)SiNH]_3$ were carried out. The preceramic polymers produced are tabulated in Tables 13 and 14.

TABLE 13

Hydrosilylation Reactions of the Polycarbosilane with $[(CH_3)(CH_2{=}CH)SiNH]_3{}^a$

| Sample Number | Solvent | Weight Ratio of Polycarbosilane to $[(CH_3)(CH_2{=}CH)SiNH]_3$ | Reflux Time (Hours) | Polymer Solubility[b] |
|---|---|---|---|---|
| YFY IV-10 | Benzene | 1.17:1 | 24 | Soluble |
| YFY IV-2 | Benzene | 3.50:1 | 20 | Soluble |
| YFY IV-8 | Benzene | 7.00:1 | 24 | Soluble |
| YFY IV-14 | Benzene | 14.00:1 | 20 | Soluble |

[a]All of these reactions gave a quantitative yield.
[b]Solubility of the polymer in hexane, benzene, and THF.

TABLE 14

Physical Data of the Soluble Polymers Listed in Table 13.

| Sample Number | Ceramic Yield (TGA[a]) (%) | $T_{\frac{1}{2}}{}^d$ (0° C.) | M.W.[b] (g/mol) | $^1$NMR[c] Integration Ratio |
|---|---|---|---|---|
| YFY IV-10 | 71 | 500 | 560 | 2.4:1:13.7 |
| YFY IV-2 | 78 | 530 | 900 | 1:1:9.6 |
| YFY IV-8 | 79 | 620 | 1350 | 0.6:1:8.5 |
| YFY IV-14 | 75 | 580 | 1280 | 0.3:1:8.3 |

[a]Under argon, 25–1000° C., 10° C./min.
[b]Cryoscopic in Benzene.
[c]Ratio of SiCH=CH$_2$:SiH:(SiCH$_2$—CH$_2$Si,SiCH$_3$ and SiCH$_2$Si).
[d]Temperature at which one-half of the weight loss had occurred.

P. HYDROSILYLATION REACTION OF THE POLYCARBOSILANE WITH $[(CH_3)(CH_2{=}CH)SiO]_m$(m=4,5,6) INITIATED BY AIBN (IV-13)

Figure 2:
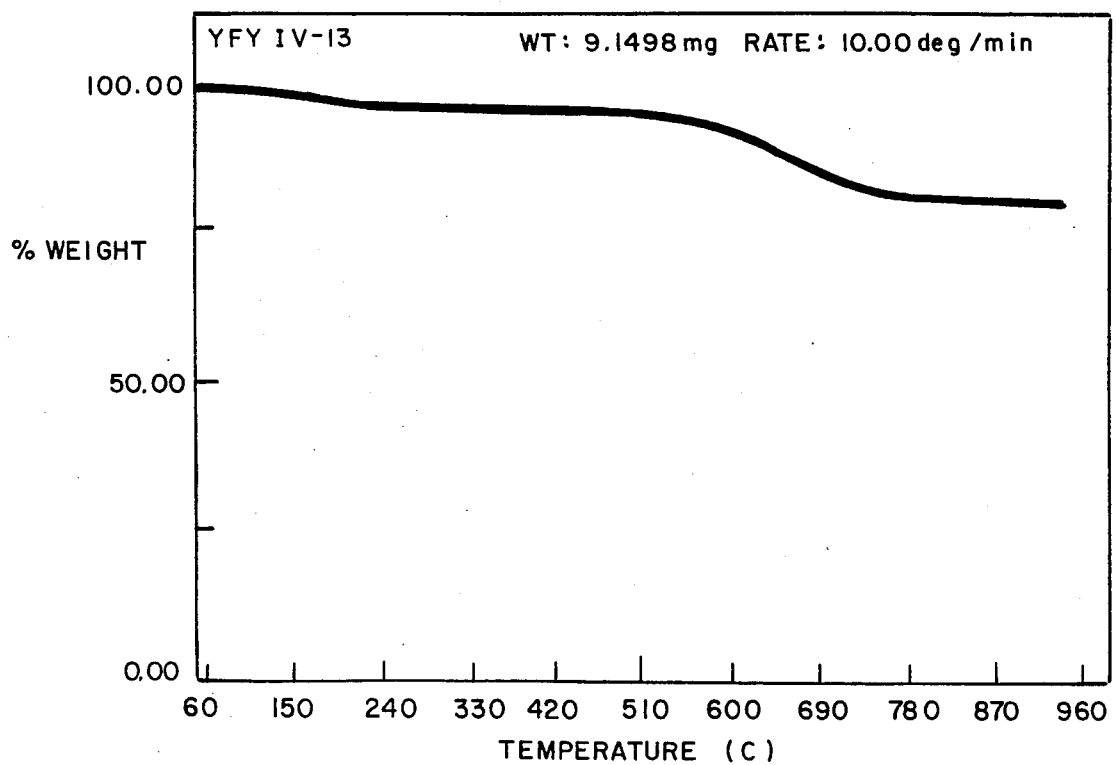
FIG. 2 is a TGA curve of polymer (YFY IV-13) formed by the hydrosilylation reaction of a polycarbosilane with [(CH$_3$)(CH$_2$=CH)SiO]$_m$ (m=4, 5 and 6).

According to the procedure described above, the reaction between the polycarbosilane (3.5 g) 0.05 g (0.30 mmol) of AIBN, and 0.5 g (0.0056 mol of (CH$_3$)(CH$_2${=}CH)SiO unit) of $[(CH_3)(CH_2{=}CH)SiO]_m$ in 50 ml of benzene was carried out under a nitrogen atmosphere. The resulting solution was heated gently at reflux for 18 hours. The reaction mixture was allowed to cool to room temperature and stirred for an additional hour. The solvent was removed by trap-to-trap distillation to give 3.98 g (99% yield by weight) of a white powder. The polymer is soluble in hexane, benzene, and THF. The TGA curve of the polymer is shown in FIG. 2.

$^1$H NMR (90 MHz, C$_6$D$_6$): δ5.96 multiplet, SiCH=CH$_2$, 0.5H), 4.57 (broad, SiH, 1H) 0.84 (singlet, SiCH$_2$CH$_2$Si) 0.27 (broad, SiCH$_3$, and SiCH$_2$Si, 8.8H for the total area of SiCH$_2$CH$_2$Si, SiCH$_3$ and SiCH$_2$Si).

Molecular weight (cryoscopic in benzene): 1660 g/mol

TGA (25°–1000° C., 10° C./min): 80% yield of a black ceramic solid).

Melting point (sealed capillary under vacuum): softens at 200° C., melts at 200°–230° C.

Anal. Found: C, 41.54; H, 7.85; Si, 48.86; O, 1.96. Total: 100.21%

Large scale pyrolysis of a sample under argon gave a 78% yield of a black ceramic solid (25°–1000° C., 10° C./min).

Anal. Found: C, 36.07; H, 0.89; Si, 61.04; O, 2.51. Total: 100.51%; Composition: 1SiC+0.43C+0.04SiO$_2$ (equivalent to 10.8 weight % of free carbon)

Using the same general procedure outlined above, the reactions between the polycarbosilane with [(CH$_3$)(CH$_2$=CH)SiO]$_m$ in different weight ratios were carried out. The preceramic polymers produced are tabulated in Tables 15 and 16.

TABLE 15

Hydrosilylation Reactions of Polycarbosilanes with [(CH$_3$)(CH$_2$=CH)SiO]$_m{}^a$

| Sample Number | Solvent | Weight Ratio of Polycarbosilane to [(CH$_3$(CH$_2$=CH)SiO]$_m$ | Reflux Time (Hours) | Polymer Solubility$^b$ |
|---|---|---|---|---|
| YFY IV-4 | Benzene | 3.5:1 | 19 | Soluble |
| YFY IV-13 | Benzene | 7:1 | 18 | Soluble |
| YFY IV-15 | Benzene | 14:1 | 20 | Soluble |

$^a$All of these reactions gave a quantitative yield.
$^b$Solubility of the polymer in hexane, benzene, and THF.

TABLE 16

Physical Data of the Soluble Polymers Listed in Table 3

| Sample Number | Ceramic Yield (TGA$^a$) (%) | T$_\frac{1}{2}$ (0° C.) | M.W.$^b$ (g/mol) | $^1$H NMR$^c$ Integration Ratio |
|---|---|---|---|---|
| YFY IV-4 | 82 | 650 | 1200 | 1:1:6.2 |
| YFY IV-13 | 80 | 640 | 1660 | 0.5:1:6.6 |
| YFY IV-15 | 76 | 550 | 1180 | 0.3:1:6.2 |

$^a$Under nitrogen, 25–1000° C., 10° C./min.
$^b$Cryoscopic in benzene.
$^c$Ratio of SiCH=CH$_2$:SiH:(SiCH$_2$CH$_2$Si,SiCH$_2$Si, and SiCH$_3$).

Q. HYDROSILYLATION REACTION OF POLYCARBOSILANE WITH POLYBUTADIENE INITIATED BY AIBN (IV-5)

Figure 3:
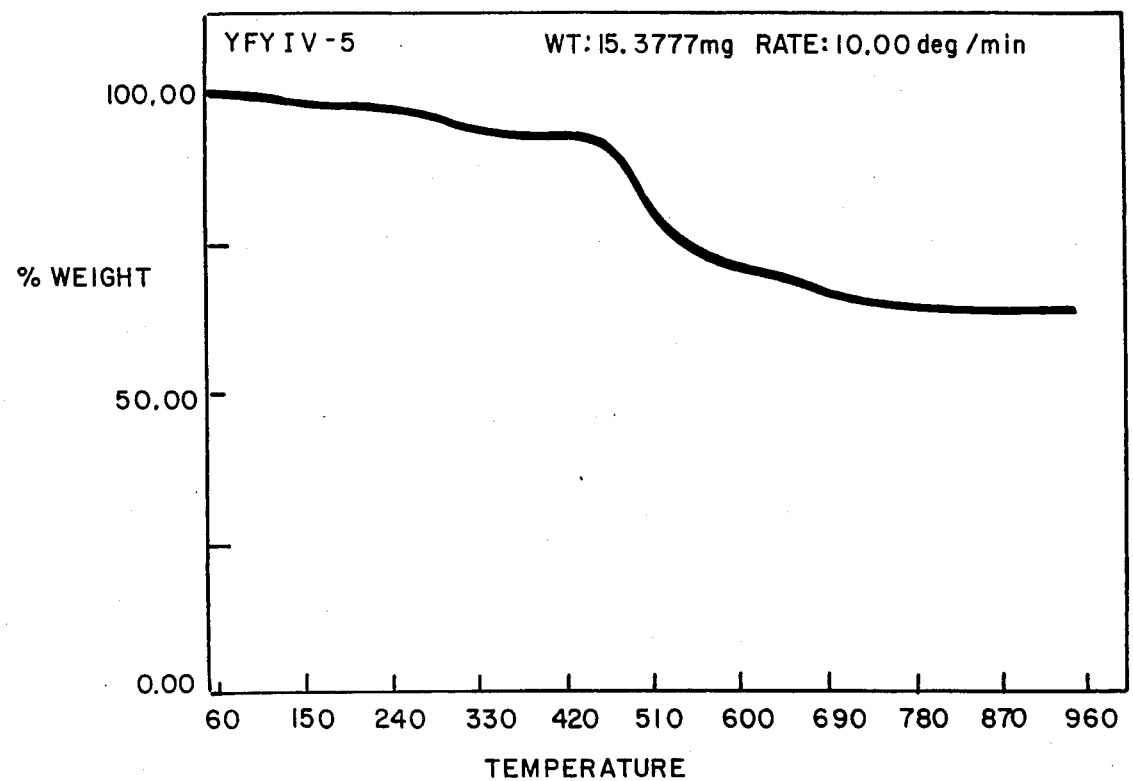
FIG. 3 is a TGA curve of a polymer (YFY IV-5) formed by the hydrosilylation reaction of polycarbosilane with polybutadiene.

According to the procedure described above, the reaction between the polycarbosilane (3.5 g), 0.05 g (0.30 mmol) of AIBN, and 0.86 g (0.007 mol of CH$_2$=CH unit) of polybutadiene (Aldrich #20050-6, containing 45% vinyl, 55% 1,4) in 40 ml of benzene was carried out under a nitrogen atmosphere. The resulting solution was heated gently at reflux for 20 hours. The reaction mixture was allowed to cool to room temperature. The solvent was removed by trap-to-trap distillation to give 4.35 g (99% yield of weight) of a white powder. The polymer is soluble in benzene. The TGA curve of the polymer is shown in FIG. 3.

$^1$H NMR (90 MHz, C$_6$D$_6$): δ5.44, 5.07 (broad, CH$_2$=CH, 2H), 4.50 (broad, SiH, 1H), 2.08, 1.30 (singlet, CH$_2$ of polybutadiene, 2.4$\overline{\text{H}}$), 0.84 (s, SiCH$_2$CH$_2$Si), 0.24 (broad, SiCH$_3$, 11H for the total area of SiCH$_2$CH$_2$Si, SiCH$_3$ and SiCH$_2$Si).

Molecular weight (cryoscopic in benzene): 1240 g/mol.

Melting point (sealed capillary under vacuum): softens at 105° C., melts at 165°–185° C., no further change up to 300° C.

TGA (25°–1000° C., 10° C./min): 62% yield of a black ceramic solid. T$_\frac{1}{2}$=510° C.

R. HYDROSILYLATION REACTION OF THE POLYCARBOSILANE WITH [(CH$_3$)$_2$(CH$_2$=CH)Si]$_2$NH INITIATED BY AIBN (IV-6)

According to the procedure described above, the reaction between the polycarbosilane (3.5 g), 0.05 g (0.30 mmol) of AIBN, and 3.2 g of [(CH$_3$)$_2$(CH$_2$=CH)Si]$_2$NH in 50 ml of benzene was carried out under a nitrogen atmosphere. The resulting solution was heated gently at reflux for 36 hours. The reaction mixture was allowed to cool to room temperature. The solvent was removed by trap-to-trap distillation to give 4.43 g (66% yield by weight) of a white powder. The polymer is soluble in hexane, benzene, and THF.

$^1$H NMR (90 MHz, C$_6$D$_6$): δ5.93 (multiplet, SiCH=CH$_2$, 1H), 4.50 (broad, SiH, 1H), 0.84, 0.24, 0.13 (broad, SiCH$_3$, SiCH$_2$—CH$_2$, SiC$\overline{\text{H}}_2$Si and NH, 18H for the total area)

Molecular weight (cryoscopic in benzene): 680 g/mol.

Melting point (sealed capillary under vacuum): softens at 110° C., melts at 125°–160° C., no further change up to 300° C.

TGA (25°–1000° C., 10° C./min): 65% yield of a black ceramic solid. T$_{178}$ =360° C.

S. HYDROSILYLATION REACTION OF A MIXTURE OF THE POLYCARBOSILANE AND THE [(CH$_3$SiH)$_x$(CH$_3$Si)$_y$]$_n$ POLYSILANE WITH CYCLO-[(CH$_3$)(CH$_2$=CH)SiNH]$_3$ INITIATED BY AIBN

As in the previous experiments, a reaction was carried out between 1.75 g of the polycarbosilane, 1.75 g of the polysilane and 0.5 g (2.0 mmol) of cyclo-[(CH$_3$)(CH$_2$=CH)SiNH]$_3$ in the presence of 0.05 g (0.30 mmol) of AIBN in 40 ml of benzene for 24 hours at reflux (under nitrogen). Removal of solvent at reduced pressure left 3.84 g (96%) of a white powder which was soluble in hexane, benzene and THF.

$^1$H NMR (250 MHz, C$_6$D$_6$): δ5.04, 4.60, 4.03 (broad, SiH, 1H), 1.07 (SiCH$_2$CH$_2$Si), 0.42, 0.27 (broad, SiCH$_3$ and SiCH$_2$Si), 8.4$\overline{\text{H}}$ total for SiCH$_2$CH$_2$Si, SiCH$_3$, SiCH$_2$Si and NH).

Molecular weight (cryoscopic in benzene): 1160 g/mol.

TGA (25°–1000° C., 10° C./min): 66% yield of a black ceramic solid.

Melting point (sealed capillary under vacuum): seems to soften 270° C. but does not melt up to 350° C.

Anal. Found: C, 35.82; H, 8.51; Si, 54.77; N, 7.09%

Large scale pyrolysis of a sample in a tube furnace under argon gave a black ceramic in 58% yield.

Anal. Found: C, 28.05; H, 0.55; Si, 64.18; N, 1.83%; Calculated composition: 1SiC+0.01Si$_3$N$_4$+0.07C (1.8 wt % carbon).

T. PREPARATION OF [(CH$_3$)(H)SiC≡C]$_n$ (1) Organolithium Procedure. (KOP-I-28).

A 250 ml flask equipped with an addition funnel, a reflux condenser, a gas inlet/outlet system, a rubber septum and a magnetic stir-bar was charged with a suspension of 158 mmol of LiC≡CLi (via 2 n-BuLi or 2 i-Pr$_2$NLi+HC≡CH) in 40 ml of THF and 130 ml of hexane. The solvent was removed at reduced pressure and replaced with 35 ml of THF, then 16.5 ml (157 mmol) of CH$_3$SiHCl$_2$ was added from the separatory funnel, dropwise at room temperature under nitrogen. An ice bath was used to moderate the exothermic reaction. After the addition was completed, the mixture was heated at reflux for 4 hours. The resulting yellow-brown solution which contained a white precipitate was then treated with 5 ml (45.4 mmol) of (CH$_3$)$_2$SiHCl. Subsequently, it was heated at reflux for another hour. Filtration was followed by removal of volatiles from the filtrate at reduced pressure. The residue was extracted with toluene and the extracts were filtered and evaporated at reduced pressure. A brown, viscous liquid remained (10.3 g, 95% yield based on LiC$_2$Li).

Molecular weight (cryoscopy in benzene: 430).

Ceramic yield (by TGE): 77.4%, giving a black, brittle solid.

Analysis. Calcd (on basis of $^1$H NMR integration): C, 52.09; H, 7.28; Si, 40.61. Found: C, 51.44; H, 6.46; Si, 35.76%.

$^1$H NMR (C$_6$D$_6$): δ−0.12−0.25 (SiCH, 3.6H), 1.95(≡CH, 0.2H), 3.95−4.35 (SiH, 1H).

IR (KBr): 3300, 3000, 2890, 2190, 2060, 1415, 1265, 1075, 955, cm$^{-1}$.

Very similar results were obtained when the CH$_3$SiHCl$_2$ and (CH$_3$)$_2$SiHCl were added together or, when using this procedure, (CH$_3$)$_2$(CH$_2$=CH)SiCl was used in place of (CH$_3$)$_2$SiHCl(KOP-I-70).

In another experiment similar to that described in detail above the ceramic material obtained on pyrolysis of the [CH$_3$(H)SiCC]$_n$ in 80% yield was analyzed: C, 53.15; Si, 46.35; which gives a composition of 1SiC+1.68C.

(2) Organomagnesium Procedure (KOP-III-2)

A similar procedure was used in the reaction of (MgC≡C)$_n$ in a THF/hexane/heptane mixture with an equimolar amount of CH$_3$SiCHCl$_2$ and later some (CH$_3$)$_2$SiHCl. An orange, sticky product (80% yield) was obtained, molecular weight 900, ceramic yield on pyrolysis to 1000° C. (TGA): 81%. The NMR spectrum was in agreement with the [CH$_3$(H)SiC≡C]$_n$ formulation.

$^1$H NMR (C$_6$D$_6$): δ0.02, 0.06 (SiCH$_3$), 2.04 (HC≡C, trace), 4.3 (SiH); SiCH$_3$ proton to SiH proton ratio: 3.7:1 (due to addition of (CH$_3$)$_2$SiHCl end-capper. $^{13}$C NMR (C$_6$D$_6$): -3.8 (SiCH$_3$), 96.69 (HC≡C, trace), 109.44 (C≡C).

PREPARATION OF [(CH$_3$)(CH$_2$=CH)SiC≡C]$_x$ (1) Organolithium Route. (KOP-II-67)

A 500 ml flask equipped with an addition funnel, a reflux condenser, a gas inlet/outlet system, a septum and a stir-bar was charged with a suspension of 221 mmol of LiC≡CLi (via i-Pr$_2$NLi+HC≡CH) in 300 ml of THF. Methylvinyldichlorosilane (221 mmol) was added dropwise with stirring under nitrogen. An exothermic reaction took place. The reaction mixture was heated at reflux for 24 hours, then 4 ml of (CH$_3$)$_2$SiHCl was added. Volatiles were removed at reduced pressure and to the residue was added 200 ml of hexane. The resulting slurry was treated with 200 ml of water. The organic layer was dried and evaporated at reduced pressure, leaving 17.7 g (85%) of a yellow-brown wax, molecular weight 1000, which gave a ceramic yield on pyrolysis to 1000° C. of 76% (by TGA). The spectroscopic properties supported the expected structure, [(CH$_3$)(CH$_2$=CH)SiC≡C]$_n$ $^1$H NMR (C$_6$D$_6$): δ0.18 (SiCH$_3$), 2(HC≡C; trace), 5.9 (SiCH=CH$_2$); CH$_3$/CH$_2$=CH ratio=1.

$^{13}$C NMR (C$_6$D$_6$): δC −1.46, −1.78 (SiCH$_3$), 96.9 (HC≡C), 110.6−(−C≡C−), 132.3, 136.0 (CH$_2$=CH).

(2) Organomagnesium Procedure. (KOP-III-3)

Essentially the same procedure was used in the reaction of 169 mmol of (MgC≡C)$_n$ (via Bu$_2$Mg+HC≡CH in a THF/hexane/heptane mixture) with 169 mmol of CH$_3$(CH$_2$=CH)SiCl$_2$. The reaction mixture was heated at reflux for 18 hours. Work-up was the same as in paragraph U(1) above. A yellow wax, molecular weight 1100, 83% ceramic yield on pyrolysis to 1000° C. (TGA), was obtained in 84% yield, mp 45°−50° C. The $^1$H and $^{13}$C NMR spectra, as in paragraph U(1) above, support [(CH$_3$)(CH$_2$=CH)SiC≡C]$_n$ structure.

REACTION OF [(CH$_3$SiH)$_x$(CH$_3$Si)$_y$]$_n$ WITH [CH$_3$(H)SiC≡C]$_n$ IN THE PRESENCE OF AIBN

A 50 ml flask equipped with a reflux condenser, a gas inlet/outlet system, a rubber septum and a magnetic stir-bar was charged with the two polymers prepared as described above in paragraphs B and T and 20 ml of benzene and the solution was stirred for 5 minutes. AIBN (50 mg) was added and then the mixture was stirred and heated at reflux, under nitrogen. A color change from yellow-brown to dark red was noted. Removal of the benzene left a polymeric residue. Further details are given in Tables 17 and 18.

TABLE 17

[A] (MeSiH)$_{0.34}$(MeSi)$_{0.65}$ + [B] (MeSiH—C≡C)$_n$ $\xrightarrow{\text{AIBN}}$

| Sample Number | Molar: Ratio A:B* | Reflux Time | Yield | Product | Ceramic Yield (TGA) | NMR (SiH:SiCH) |
|---|---|---|---|---|---|---|
| KOP-I 57 | 1.64:1 | 50 min | quant. | glasslike | 83% | 1:6.9 |
| KOP-I 58 | 3.5:1 | 50 min | quant. | glasslike | 75% | 1:6.5 |
| KOP-I 74 | 1:1 | 16 hrs | quant. | powder | 85.7% | 1:7.1 |

TABLE 17-continued $$(MeSiH)_{0.34}(MeSi)_{0.65} \;\; [A] \;\; + \;\; (MeSiH-C\equiv C)_n \;\; [B] \;\; \xrightarrow{AIBN}$$

| Sample Number | Molar: Ratio A:B* | Reflux Time | Yield | Product | Ceramic Yield (TGA) | NMR (SiH:SiCH) |
|---|---|---|---|---|---|---|
| KOP-I 75 | 2:1 | 16 hrs | quant. | powder | 88.2% | 1:9.4 |

*calculated on the basis of molar ratio SiH—bonds/C≡C—bonds in A versus B
TGA of A: 54.%
of B: 78.5%

TABLE 18

$$[(MeSiH)_{0.8}(MeSi)_{0.2}] \;\; [A] \;\; + \;\; (MeSiH-C\equiv C)_n \;\; [B] \;\; \xrightarrow{AIBN}$$

| Sample Number | Molar Ratio A:B* | Reflux Time | Yield | Product | Ceramic Yield (TGA) | NMR (SiH:SiCH) |
|---|---|---|---|---|---|---|
| KOP-I-61 | 2:1 | 90 min | quant. | sticky, glasslike | 78.9% | 1:4.7 |
| KOP-I-62 | 4:1 | 90 min | quant. | sticky, glasslike | 75.5% | 1:5.8 |
| KOP-I-63 | 7.3:1 | 90 min | quant. | sticky, glasslike | 67.8% | 1:5.1 |
| KOP-II-11 | 2:1 | 3 hrs | quant. | glasslike | 88.2% | — |
| KOP-II-10 | 2:1 | 13 hrs | quant. | powder | 84.5% | — |
| KOP-II-4 | 2:1 | 15 hrs | quant. | powder | 87.6% | 1:4.5 |
| KOP-II-5 | 4:1 | 15 hrs | quant. | powder | 75.4% | 1:15 |

*See footnote in Table 17.

W. REACTION OF $[(CH_3)(CH_2=CH)SiC\equiv C]_n$ WITH $[(CH_3SiH)_{0.8}(CH_3Si)_{0.2}]_n$ IN THE PRESENCE OF AIBN

General Procedure

A 50 ml flask equipped with a reflux condenser, a gas inlet/outlet system, two septa and a stir-bar was charged with both polymers prepared as described above in paragraphs B and U. Benzene (20 ml) and 60 mg of AIBN were added and then the solution was stirred and heated at reflux under nitrogen for specified periods of time. Subsequently, volatiles were removed at reduced pressure to leave the hybrid polymer. The experiments are summarized in Table 19.

TABLE 19

A = $[MeSiH)_{0.8}(MeSi)_{0.2}]_n$    TGA: 25% MW 650
B = $(MeViSi-C\equiv C)_x$    TGA: 72% MW 800

| Sample Number | Ratio A:B* | Reflux Time | Product Properties** | Ceramic Yield (TGA) |
|---|---|---|---|---|
| KOP-II-39 | 4.6:1 | 2 hr | insoluble; orange, brittle solid | 79.1% |
| KOP-II-40 | 3.4:1 | 1 hr | insoluble; yellow powder | 82.1% |
| KOP-II-41 | 10:1 | 1.5 hr | solububle yellow, sticky viscous*** | 66.2% |
| KOP-III-8 | 1:1 | 0.5 hr | soluble, yellow, sticky | 87.8% |
| KOP-III-9 | 2:1 | 0.5 hr | slightly sol., yellow solid | 83.7% |
| KOP-III-10 | 3:1 | 0.5 hr | insoluble yellow powder | 82.9% |
| KOP-III-13 | 1:1 | 0.25 hr | soluble, yellow, sticky | 86.0% |
| KOP-III-14 | 2:1 | 0.25 hr | soluble, yellow, sticky | 84.2% |
| KOP-III-15 | 3:1 | 0.25 hr | soluble yellow, sticky | 80.9% |

*See footnote, Table 17.
**Obtained in quantitative yield.
***Mol. weight 950.

X. CERAMIC APPLICATIONS

Polymer III-2 was prepared from $[(CH_3SiH)_x(CH_3Si)_y]_n$ and cyclo-$[(CH_3)(CH_2=CH)SiNH]_3$(SiH/SiCH=CH_2$ molar ratio=6) in refluxing benzene in the presence of AIBN.

1. Preparation of Ceramic Fibers

In a dry box, approximately 1 g sample of III-2, Example E, (large scale preparation of II-26) was dissolved in toluene (ca. 10 ml). The solution was concentrated under vacuum until a fibrous, gummy material was obtained. Fibers approximately 1 ft long were pulled with a glass rod dipped into the gummy solid. The fibers were quickly placed in a fused silica crucible which was in turn placed in a quartz tube furnace and flushed with nitrogen. The polymer fibers then were converted into ceramic fibers by pyrolyzin them at 10° C./min to 1000° C. This produced black ceramic fibers. SEM micrographs of several fibers were taken.

2. Preparation of Ceramic Bars by Polymer Pyrolysis (a) From Mixed Polymer Prepared in Example E The polymer (3.0 g, III-2) was loaded into a 3.9 cm×1.3 cm×3.7 cm rectangular steel die and uniaxially pressed at 5000 lbs for minutes. The polymer bar was then bagged and isostatically pressed at 40,000 psi for 1 minute. The sample was placed in a quartz tube in a tube furnace and pyrolyzed under nitrogen at 1000° C., heating at 10° C./min. A black rectangular shaped bar was obtained. The ceramic bar lost 49% of its original weight. SEM micrographs of th ceramic bar were obtained.

(b) From Mixed Polymer Prepared as in Example O

The polymer (IV-8, 2.25 g) was loaded into a 3.9 cm×1.3 cm×3.7 cm rectangular steel die and uniaxially pressed at 5000 lbs for min. The polymer bar was then bagged and isostatically pressed at 40,000 psi for one minute. The sample was placed in the quartz tub furnace and pyrolyzed under argon to 1000° C., heating at 10° C./min. A black, foam product was obtained with a loss of 26% of the original weight.

(c) From Mixed Polymer Prepared as in Example P

The polymer (IV-13, 2.25 g) was loaded into a 3.9 xm×1.3 cm 3.7 cm rectangular steel die and uniaxially pressed at 5000 lbs for min. The polymer bar was then bagged and isostatically pressed at 40,000 psi for one minute. The sample was placed in the quartz tub furnace and pyrolyzed under argon to 1000° C., heating at 10° C./minute. A black, foam product was obtained with a loss of 25% of the original weight.

3. Preparation of SiC Powder Composites

In a dry box, 2.4 g of fine β-SiC powder and 0.6 g (20% by weight) of polymer (III-2) were combined in a 100 ml round-bottomed flask. The flask was removed from the dry box, charged with 10 ml toluene, and the ceramic powder was dispersed ultrasonically for 1 hour. The toluene was removed on a rotary evaporator and the ceram powder/polymer was dried further under vaccuum for about 30 minutes. The residue was removed from the flask and lightly ground with a mortar and pestle to produce a fine powder. The powder was loaded into a 3.9 cm×1.3 cm×3.7 cm rectangular steel die and uniaxially pressed at 5000 lbs for 5 minutes. The bar of ceramic powder was then bagged and isostatically pressed at 40,000 psi for 1 minute. The sample was placed in a quartz tube in a tube furnace and pyrolyzed under nitrogen to 1000° C., heating at 10° C./min. A slightly shrunk ceramic bar was formed which had lost 9% of its original weight. SEM micrographs of the ceramic bar were obtained.

This invention has been described in detail with reference to the preferred embodiments thereof. However, it will be appreciated that those skilled in the art upon consideration of this disclosure may make modifications and improvements within the scope and spirit of the invention as described in the claims.

We claim:

1. A method for preparing preceramic organosilicon polymers, where the method comprises:
    (a) mixing an organic polysilane having a plurality of Si—H functional groups with a sufficient quantity of an organosilicon compound containing at least two alkenyl groups or a cyclic organic compound containing at least three alkenyl groups, to undergo a hydrosilylation reaction;
    (b) allowing the mixture of step (a) to react, thereby forming said preceramic organosilicon polymer.

2. A method for preparing preceramic organosilicon polymers, where the method comprises:
    (a) mixing a polycarbosilane having a multiplicity of repeat units of the formula, $[R^aSi(H)—(ORG)_q]$, where $R^a$ is H, a lower alkyl group having from 1 to about 6 carbon atoms, a cycloalkyl group having 3 to about 6 carbon atoms, or a substituted or unsubstituted lower aryl group having from 6 to about 10 carbon atoms, (ORG) is a difunctional alkylene, alkenylene or alkynylene group, and q is an integer 1 or greater, with a predetermined quantity of an organic or organosilicon compound containing at least two alkenyl groups to undergo a hydrosilylation reaction;
    (b) allowing the mixture of step (a) to react, thereby forming said preceramic organosilicon polymer.

3. The method of claim 2 wherein the reaction of step (b) is initiated by the generation of reactive free radicals.

4. The method of claim 3 in which an appropriate input of energy generates the reactive free radicals.

5. The method of claim 2 wherein the repeat units are selected from the group consisting of the formula $[R^aSi(H)—(CH_2)_q]$, $[R^aSi(H)—CH=CH]$, $[R^aSi(H)—C≡C]$, and mixtures thereof.

6. The method of claim 4 wherein the energy source for the generation of free radicals is initiated by heat.

7. The method of claim 3 wherein the generation of free radicals is initiated by ultraviolet irradiation in the presence or the absence of a catalyst.

8. The method of claim 3 wherein the generation of free radicals is initiated by a free radical catalyst selected from the group consisting of peroxides and azo compounds.

9. The method of claim 8 wherein the azo compound is azobisisobutyronitrile.

10. The method of claim 8 wherein the peroxide is an organic peroxide.

11. The method of claim 10 wherein the organic peroxide is benzoyl peroxide.

12. The method of claim 3 which further comprises adding a transition metal catalyst which is effective in hydrosilylation reactions to the mixture of step (a).

13. The method of claim 12 wherein the transition metal catalyst is $H_2PtCl_6.6H_2O$.

14. The method of claim 2 wherein the polycarbosilane has at least about 25 mole % of repeat units of the formula $[R^aSi(H)—(CH_2)_q]$.

15. The method of claim 6 wherein the mixture is heated to 70°–90° C.

16. The method of claim 3 wherein the alkenyl group of the alkenyl containing compound is a lower alkenyl group having 2 to 6 carbon atoms.

17. The method of claim 16 wherein the alkenyl group is $CH_2=CH$.

18. The method of claim 1 wherein the organic polysilane contains a lower alkyl group.

19. The method of claim 2, wherein $R^a$ is the lower alkyl group.

20. The method of claim 16, wherein $R^a$ is the lower alkyl group.

21. The method of claim 19, wherein $R^a$ is $CH_3$.

22. The method of claim 20, wherein $R^a$ is $CH_3$.

23. The method of claim 2 where q is 3 to 1.

24. The method of claim 2 where q is 1.

25. The method of claim 20 wherein the organosilicon compound is selected from the group consisting of $[R^1_2(A)Si]_2Y$, $[R^1(A)_2Si]_2Y$, $[(A)_3Si]_2Y$, $[R^1ASiY]_n$, $R^1_n(A)_{3-n}Si—Si(A)_{3-q}R^1_q$, $(A)_4Si$, and cyclo-$[(A)_2SiY^1]_m$ where $Y=O$, S, NH, $NR^2$, $CH_2$, $CH=CH$, $C≡C$ $CH_2CH_2$,

and other organic bridges; n and q are 0, 1 or 2, except where it causes the compound to be non-existant, n may be the same or different than q; $Y^1=O$, S, NH, $NR^2$, $CH_2$, $CH=CH$, $C≡C$, m is 2 or greater when $Y^1$ is NH, $NR^2$, S, $CH_2$, $CH=CH$ and $C≡C$, and m is 3 or greater when $Y^1$ is O; $R^1$ is a substituted or unsubstituted lower alkyl group having 1-6 carbon atoms, or a substituted or unsubstituted lower aryl group having 6-10 carbon atoms, $R^2$ is defined as $R^1$ and can be the same or different and A is a substituted or unsubstituted vinyl group or a substituted or unsubstituted allyl group.

26. The method of claim 25 wherein $[R^1ASiY]_n$ is cyclo-$[R^1(A)SiY^1]_m$.

27. The method of claim 25 wherein A is vinyl.

28. The method of claim 21 wherein the organosilicon compound is selected from the group consisting of
cyclo-$[(CH_3)(CH_2\!=\!CH)SiO]_4$,
cyclo-$[(CH_3)(CH_2\!=\!CH)SiO]_5$,
cyclo-$[(CH_3)(CH_2\!=\!CH)SiO]_6$,
combinations of cyclo-$[(CH_3)(CH_2\!=\!CH)SiO]_n$, n=at least, 4,
cyclo-$[(CH_3)(CH_2\!=\!CH)SiS]_3$,
cyclo-$[(CH_3)(CH_2\!=\!CH)SiNH]_3$
cyclo-$[(CH_3)(CH_2\!=\!CH)SiNH]_4$,
and combinations of cyclo-$[(CH_3)(CH_2\!=\!CH)SiNH]_n$, n=at least 3.

29. The method of claim 2 wherein an organopolysilane of the formula $[(RSiH)_x(RSi)_y]_n$, where x+y=1, n is an integer greater than 1, R is a lower alkyl group having from about 1 to about 6 carbon atoms, a lower alkenyl group having from 2 to about 6 carbon atoms, a substituted or unsubstituted lower aryl group having from 6 to about 10 carbon atoms or a tri(lower)alkyl- or di(lower)alkylsilyl group is added to create a ternary preceramic polymer.

30. The method of claim 29 wherein the organopolysilane is added in sufficient quantity so that the excess silicon obtained on pyrolysis of the organopolysilane can react with excess carbon from the pyrolysis of the polycarbosilane and the alkenyl containing organic or organosilicon compound, thereby minimizing the amount of free carbon or silicon.

31. The method of claim 30 wherein R is the lower alkyl group.

32. The method of claim 31 wherein R is $CH_3$.

33. The method of claim 30 wherein the organic substituents in the silicon compound other than the alkenyl groups are $CH_3$.

34. The method of claim 29 wherein the organopolysilane is $[(CH_3SiH)_x(CH_3Si)_y]_n$.

35. The method of claim 33 wherein the organopolysilane is $[(CH_3SiH)_x(CH_3Si)_y]_n$.

36. The method of claim 30 wherein all non-alkenyl substituents are $CH_3$.

37. The method of claim 31 wherein the organopolysilane is $[(CH_3SiH)_x(CH_3Si)_y]_n$.

38. The method of claim 37 wherein the mixture is heated to 70°–90° C.

39. A preceramic polymer formed by the method of claim 1.

40. A preceramic polymer formed by the method of claim 2.

41. A preceramic polymer formed by the method of claim 5.

42. A preceramic polymer formed by the method of claim 14.

43. A preceramic polymer formed by the method of claim 21.

44. The method of claim 3 wherein an organopolysilane of the formula $[(R^aSiH)_x(R^aSi)_y]_n$, where x+y=1, n is an integer greater than 1, $R^a$ is a lower alkyl group having from about 1 to about 6 carbon atoms, a lower alkenyl group having from 2 to about 6 carbon atoms, a substituted or unsubstituted lower aryl group having from 6 to about 10 carbon atoms or a tri(lower)alkyl- or di(lower)alkylsilyl group is added to create a ternary preceramic polymer.

45. The method of claim 44 wherein the organopolysilane is added in sufficient quantity so that the excess silicon obtained on pyrolysis of the organopolysilane can react with excess carbon from the pyrolysis of the polycarbosilane and the alkenyl-containing organic or organosilicon compound, thereby minimizing the amount of free carbon or silicon.

46. The method of claim 45 wherein $R^a$ is the lower alkyl group.

47. The method of claim 46 wherein $R^a$ is $CH_3$.

48. The method of claim 46 wherein R is a lower alkyl group.

49. The method of claim 47 wherein R is a lower alkyl group.

50. The method of claim 46 wherein R is $CH_3$.

51. The method of claim 48 wherein all non alkenyl substituents are $CH_3$.

52. The method of claim 49 wherein all non alkenyl substituents are $CH_3$.

53. A preceramic polymer formed by the method of claim 45.

54. A preceramic polymer formed by the method of claim 47.

55. A preceramic polymer formed by the method of claim 48.

56. A preceramic polymer formed by the method of claim 49.

57. A preceramic polymer formed by the method of claim 51.

58. A preceramic polymer formed by the method of claim 52.

59. The method of claim 3 wherein the polycarbosilane polymer has at least about 35 mole % of repeat units of the formula $[R^aSi(H)\!-\!(CH_2)_q]$.

60. The method of claim 3 wherein the polycarbosilane polymer has at least about 50 mole % of repeat units of the formula $[R^aSi(H)\!-\!(CH_2)_q]$.

61. The method of claim 20 wherein the organic compound is a polyalkenyl compound.

62. The method of claim 3 wherein the organic or organosilicon compound is a compound of the formula $-[-R^1(Un)SiC\!\equiv\!C-]-_n$, where $R^1$ is a substituted or unsubstituted lower alkyl having 1–6 carbon atoms or a substituted or unsubstituted lower aryl group having 6–10 carbon atoms, Un is an unsaturated moiety, and n is an integer 1 or greater.

63. The method of claim 3 wherein at least about 25 mole % of the repeat units of the polycarbosilane are selected from the group consisting of $[R^aSi(H)\!-\!(CH_2)_q]$, $[R^aSi(H)\!-\!CH\!=\!CH]$, and $[RaSi(H)\!-\!C\ C]$.

64. The method of claim 63 wherein the polycarbosilane contains at least about 25 mole % of repeat units of the formula $[R^aSi(H)\!-\!C\!\equiv\!C]$.

65. The method of claim 61 wherein the polycarbosilane contans at least about 25 mole % of repeat units of the formula $[R^aSi(H)\!-\!CH\!=\!CH]$.

66. The method of claim 62 where $R^1$ is $CH_3$ and Un is $(CH_2\!=\!CH)$.

67. The method of claim 3 wherein the polycarbosilane polymer has at least about 35 mole % of repeat units of the formula $[R^aSi(H)\!-\!C\!\equiv\!C]$.

68. The method of claim 3 wherein the polycarbosilane polymer has at least about 35 mole % of repeat units of the formula $[R^aSi(H)\!-\!CH\!=\!CH]$.

69. The method of claim 63 wherein the polycarbosilane contains at least about 35 mole % of repeat units of the formula $[R^aSi(H)\!-\!CH\!=\!CH]$.

70. The method of claim 69 wherein the polycarbosilane contains at least about 50 mole % of repeat units of the formula $[R^aSi(H)\!-\!CH\!=\!CH]$.

* * * * *